US010622184B2

United States Patent
Knippelmeyer et al.

(10) Patent No.: US 10,622,184 B2
(45) Date of Patent: Apr. 14, 2020

(54) OBJECTIVE LENS ARRANGEMENT USABLE IN PARTICLE-OPTICAL SYSTEMS

(71) Applicants: CARL ZEISS MICROSCOPY GMBH, Jena (DE); APPLIED MATERIALS ISRAEL, LTD., Rehovot (IL)

(72) Inventors: Rainer Knippelmeyer, Herrsching am Ammersee (DE); Stefan Schubert, Oberkochen (DE)

(73) Assignees: CARL ZEISS MICROSCOPY GmbH, Oberkochen (DE); APPLIED MATERIALS ISRAEL LTD., Rehovot (IL)

( * ) Notice: Subject to any disclaimer, the term of this patent is extended or adjusted under 35 U.S.C. 154(b) by 194 days.

(21) Appl. No.: 15/632,658

(22) Filed: Jun. 26, 2017

(65) Prior Publication Data

US 2017/0294287 A1 Oct. 12, 2017

Related U.S. Application Data

(60) Continuation of application No. 15/056,143, filed on Feb. 29, 2016, now abandoned, which is a division of
(Continued)

(51) Int. Cl.
*H01J 37/141* (2006.01)
*H01J 37/28* (2006.01)
(Continued)

(52) U.S. Cl.
CPC .......... *H01J 37/141* (2013.01); *H01J 37/145* (2013.01); *H01J 37/20* (2013.01); *H01J 37/21* (2013.01);
(Continued)

(58) Field of Classification Search
CPC .. H01J 2237/141; H01J 37/141; H01J 37/145; H01J 2237/14; H01J 2237/1508;
(Continued)

(56) References Cited

U.S. PATENT DOCUMENTS 3,394,354 A 7/1968 Senzig
3,911,321 A 10/1975 Wardly
(Continued)

FOREIGN PATENT DOCUMENTS

EP 0 333 018 A2 9/1989
EP 1 018 757 A1 7/2000
(Continued)

OTHER PUBLICATIONS

Fink, R., et al.; Smart: a planned ultrahigh-resolution spectromicroscope for BESSY II,: Journal of Electron Spectrscopy and Related Phenomena; vol. 84; 1997; pp. 231-250.
(Continued)

*Primary Examiner* — Brooke Purinton
(74) *Attorney, Agent, or Firm* — Patent Portfolio Builders PLLC

(57) ABSTRACT

An objective lens arrangement includes a first, second and third pole pieces, each being substantially rotationally symmetric. The first, second and third pole pieces are disposed on a same side of an object plane. An end of the first pole piece is separated from an end of the second pole piece to form a first gap, and an end of the third pole piece is separated from an end of the second pole piece to form a second gap. A first excitation coil generates a focusing magnetic field in the first gap, and a second excitation coil generates a compensating magnetic field in the second gap. First and second power supplies supply current to the first and second excitation coils, respectively. A magnetic flux generated in the second pole piece is oriented in a same
(Continued)

direction as a magnetic flux generated in the second pole piece.

16 Claims, 13 Drawing Sheets

Related U.S. Application Data application No. 12/095,198, filed as application No. PCT/EP2006/011413 on Nov. 28, 2006, now abandoned.

(60) Provisional application No. 60/740,581, filed on Nov. 28, 2005.

(51) Int. Cl.
*H01J 37/145* (2006.01)
*H01J 37/20* (2006.01)
*H01J 37/21* (2006.01)
*H01J 37/24* (2006.01)

(52) U.S. Cl.
CPC ............. *H01J 37/24* (2013.01); *H01J 37/28* (2013.01); *H01J 2237/002* (2013.01); *H01J 2237/04922* (2013.01); *H01J 2237/04926* (2013.01); *H01J 2237/12* (2013.01); *H01J 2237/1215* (2013.01); *H01J 2237/14* (2013.01); *H01J 2237/141* (2013.01); *H01J 2237/1405* (2013.01); *H01J 2237/1415* (2013.01); *H01J 2237/2817* (2013.01)

(58) Field of Classification Search
CPC .................. H01J 37/10; H01J 2237/10; H01J 2237/04922; H01J 2237/04926; H01J 2237/1415; H01J 2237/3173; H01J 37/14; H01J 37/143; H01J 37/1475; H01J 3/20
See application file for complete search history.

(56) References Cited

U.S. PATENT DOCUMENTS

| | | | |
|---|---|---|---|
| 4,345,152 A | 8/1982 | Gerlach | |
| 4,419,581 A | 12/1983 | Nakagawa | |
| 4,585,942 A | 4/1986 | Tsuno | |
| 4,868,395 A | 9/1989 | Kasahara et al. | |
| 4,926,054 A | 5/1990 | Frosien | |
| 4,929,838 A | 5/1990 | Yasuda et al. | |
| 5,057,689 A * | 10/1991 | Nomura ............... | H01J 37/141 250/310 |
| 5,250,808 A | 10/1993 | Danilatos et al. | |
| 5,285,074 A | 2/1994 | Haire et al. | |
| 5,578,822 A | 11/1996 | Van Der Mast et al. | |
| 5,808,310 A | 9/1998 | Yamashita et al. | |
| 5,838,006 A | 11/1998 | Veneklasen et al. | |
| 5,892,224 A | 4/1999 | Nakasuji | |
| 5,900,629 A | 5/1999 | Todokoro et al. | |
| 5,920,073 A | 7/1999 | Lo et al. | |
| 6,040,576 A | 3/2000 | Benner | |
| 6,060,711 A | 5/2000 | Shimizu | |
| 6,104,034 A | 8/2000 | Frosien et al. | |
| 6,107,633 A | 8/2000 | Frosien et al. | |
| 6,194,729 B1 | 2/2001 | Weimer | |
| 6,252,412 B1 | 6/2001 | Talbot et al. | |
| 6,429,441 B1 | 8/2002 | Nakasuji | |
| 6,452,175 B1 | 9/2002 | Adamec | |
| 6,555,824 B1 | 4/2003 | Feuerbaum et al. | |
| 6,580,074 B1 | 6/2003 | Sato et al. | |
| 6,586,746 B1 | 7/2003 | Messick et al. | |
| 6,590,210 B1 | 7/2003 | Essers | |
| 6,608,317 B1 | 8/2003 | Nakasuji | |
| 6,747,279 B2 | 6/2004 | Adamec | |
| 6,897,450 B2 | 5/2005 | Yonezawa | |
| 7,005,641 B2 | 2/2006 | Nakasuji et al. | |
| 7,335,894 B2 | 2/2008 | Frosien et al. | |
| 7,560,691 B1 | 7/2009 | Gubbens | |
| 2002/0024013 A1 | 2/2002 | Gerlach et al. | |
| 2002/0028399 A1 | 3/2002 | Nakasuji et al. | |
| 2002/0033344 A1 | 3/2002 | Mabuchi et al. | |
| 2002/0033449 A1 | 3/2002 | Nakasuji et al. | |
| 2002/0036264 A1 | 3/2002 | Nakasuji et al. | |
| 2002/0088941 A1 | 7/2002 | Yonezawa | |
| 2002/0096641 A1 | 7/2002 | Yonezawa | |
| 2002/0109090 A1 | 8/2002 | Nakasuji et al. | |
| 2002/0130262 A1 | 9/2002 | Nakasuji et al. | |
| 2002/0142496 A1 | 10/2002 | Nakasuji et al. | |
| 2002/0148961 A1 | 10/2002 | Nakasuji et al. | |
| 2002/0148971 A1 | 10/2002 | Sogard | |
| 2003/0030007 A1 | 2/2003 | Karimata et al. | |
| 2003/0066961 A1 | 4/2003 | Kienzle et al. | |
| 2003/0155509 A1 | 8/2003 | Nakasuji et al. | |
| 2003/0168608 A1 | 9/2003 | Ji et al. | |
| 2003/0230714 A1 | 12/2003 | Yonezawa | |
| 2004/0056207 A1 | 3/2004 | Petrov et al. | |
| 2004/0065827 A1 | 4/2004 | Kienzle et al. | |
| 2004/0084629 A1 | 5/2004 | Preikszas et al. | |
| 2004/0113092 A1 | 6/2004 | Knippelmeyer | |
| 2004/0119023 A1 | 6/2004 | Nakasuji et al. | |
| 2005/0199820 A1 | 9/2005 | Eastham | |
| 2005/0214958 A1 | 9/2005 | Nakasuji et al. | |
| 2005/0236568 A1 | 10/2005 | Buijsse et al. | |
| 2005/0253066 A1 | 11/2005 | Watanabe et al. | |
| 2005/0263715 A1 | 12/2005 | Nakasuji et al. | |
| 2010/0038538 A1 | 2/2010 | Drexel | |
| 2012/0138791 A1 | 6/2012 | Mankos et al. | |

FOREIGN PATENT DOCUMENTS

| | | |
|---|---|---|
| EP | 1 045 426 A2 | 10/2000 |
| EP | 1 469 503 A2 | 10/2004 |
| EP | 1 498 929 A2 | 1/2005 |
| GB | 1098865 A | 1/1968 |
| JP | 55-137652 A | 10/1980 |
| JP | 57-19947 A | 2/1982 |
| JP | 57-118357 A | 7/1982 |
| JP | 59078434 A | 5/1984 |
| JP | 5-225936 A | 9/1993 |
| JP | 6-110397 A | 4/1994 |
| JP | 9-171791 A | 6/1997 |
| JP | 10-106466 A | 4/1998 |
| JP | 10-208680 A | 8/1998 |
| JP | 2000-348658 A | 12/2000 |
| JP | 2002-56794 A | 2/2002 |
| JP | 2002-507045 A | 3/2002 |
| JP | 2002-134051 A | 5/2002 |
| JP | 2004-534360 A | 11/2004 |
| JP | 2005-236061 A | 9/2005 |
| JP | 2005-251440 A | 9/2005 |
| JP | 2006-252994 A | 9/2006 |
| WO | 98/13854 A1 | 4/1998 |
| WO | 2005/024881 A3 | 3/2005 |

OTHER PUBLICATIONS

IBM, Simultaneous Shift and Scan in an SEM Using 'Scan' Coils; IBM Technical Disclosure Bulletin; XP00120021; ISSN: 0018-8689; vol. 33, No. 1A; Jun. 1, 1990; pp. 112-113.

Mueller, H., et al.; A beam separator with small aberrations; Journal of Electron Microscopy; vol. 48, No. 3; 1999; pp. 191-204.

Winograd, G.I., "A Multi-Blanker for Parallel Electron Beam Lithography"; Ph. D. thesis; May 2001; pp. 1-141.

Office Action in corresponding Japanese Patent Application No. 2008-542650 dated Aug. 28, 2012. (All references not cited herewith have been previously made of record.).

Office Action in corresponding European Patent Application No. 10 012 397.5-2208 dated Sep. 19, 2012. (All references not cited herewith have been previously made of record.).

Search Report in European Application No. 10 00 3918 dated Jun. 4, 2010. (All references not cited herewith have been previously made of record.).

(56) References Cited

OTHER PUBLICATIONS

International Search Report in corresponding International Application No. PCT/EP2006/011413 dated Jun. 6, 2007. (All references not cited herewith have been previously made of record.).
Written Opinion in corresponding International Application No. PCT/EP2006/011413 dated Jun. 6, 2007. (All references not cited herewith have been previously made of record.).
Office Action in corresponding Japanese Application 2008-542650 dated Dec. 12, 2013. (All references not cited herewith have been previously made of record.).
Office Action in corresponding Korean Application No. 10-2008-7015748 dated Sep. 13, 2013. (All references not cited herewith have been previously made of record.).
Office Action in corresponding Chinese Application No. 201010528286.2 dated Jan. 18, 2012. (All references not cited herewith have been previously made of record.).
Office Action in corresponding Chinese Application No. 201010528249.1 dated Jan. 18, 2012. (All references not cited herewith have been previously made of record.).
Extended European Search Report issued in Application No. 10012397.5, dated Dec. 28, 2010. (All references not cited herewith have been previously made of record.).
Extended European Search Report issued in Application No. 10012424.7, dated Dec. 30, 2010. (All references not cited herewith have been previously made of record.).
Extended European Search Report issued in Application No. 10012425.4, dated Jan. 20, 2011. (All references not cited herewith have been previously made of record.).
Extended European Search Report issued in Application No. 10012453.6, dated Jan. 26, 2011. (All references not cited herewith have been previously made of record.).
Extended European Search Report issued in Application No. 10012454.4 dated Jan. 26, 2011. (All references not cited herewith have been previously made of record.).
Office Action in related U.S. Appl. No. 12/095,198 dated May 26, 2011. (All references not cited herewith have been previously made of record.).
Office Action in related U.S. Appl. No. 12/095,198 dated Aug. 30, 2011. (All references not cited herewith have been previously made of record.).
Office Action in related U.S. Appl. No. 12/095,198 dated Apr. 12, 2012. (All references not cited herewith have been previously made of record.).
Office Action in related U.S. Appl. No. 12/095,198 dated Jul. 31, 2013. (All references not cited herewith have been previously made of record.).
Office Action in related U.S. Appl. No. 12/095,198 dated Dec. 30, 2015. (All references not cited herewith have been previously made of record.).
Office Action in related U.S. Appl. No. 15/056,143 dated Aug. 11, 2016. (All references not cited herewith have been previously made of record.).
Office Action in related U.S. Appl. No. 15/056,143 dated Jan. 26, 2017. (All references not cited herewith have been previously made of record.).

* cited by examiner

OBJECTIVE LENS ARRANGEMENT USABLE IN PARTICLE-OPTICAL SYSTEMS

RELATED APPLICATIONS

This application is a continuation of U.S. application Ser. No. 15/056,143, filed Feb. 29, 2016, which was a divisional of U.S. application Ser. No. 12/095,198, filed Nov. 6, 2008, which claims priority and benefit from International Application No. PCT/EP2006/011413, filed Nov. 28, 2006, which claims priority and benefit from U.S. Provisional Patent Application No. 60/740,581, filed Nov. 28, 2005, the entire teachings of each of the above documents are incorporated herein by reference.

BACKGROUND OF THE INVENTION

Field of the Invention

The present invention relates to an objective lens arrangement for use in particle-optical systems. In addition, the invention relates to a particle-optical beam system as well as a particle-optical inspection system.

The invention may be applied to charged particles of any type, such as electrons, positrons, muons, ions (charged atoms or molecules) and others.

Brief Description of Related Art

The increasing demand for ever smaller and more complex microstructured devices and the continuing demand for an increase of a throughput in the manufacturing and inspection processes thereof have been an incentive for the development of particle-optical systems that use multiple charged particle beamlets in place of a single charged particle beam, thus significantly improving the throughput of such systems. The multiple charged particle beamlets may be provided by a single column using a multi-aperture array, for instance, or by multiple individual columns, or a combination of both, as will be described in more detail below. The use of multiple beamlets is associated with a whole range of new challenges to the design of particle-optical components, arrangements and systems, such as microscopes and lithography systems.

A conventional particle-optical system is known from U.S. Pat. No. 6,252,412 B1. The electron microscopy apparatus disclosed therein is used for inspecting an object, such as a semiconductor wafer. A plurality of primary electron beams is focused in parallel to each other on the object to form a plurality of primary electron spots thereon. Secondary electrons generated by the primary electrons and emanating from respective primary electron spots are detected. For each primary electron beam a separate electron beam column is provided. The plurality of separate electron beam columns is closely packed. A density of the primary electron beam spots formed on the object is limited by a remaining footstep size of the electron beam columns forming the electron microscopy apparatus. Thus, the number of primary electron beam spots, which may be formed simultaneously on the object, is also limited in practice, resulting in a limited throughput of the apparatus when inspecting semiconductor wafers of a high surface area at a high resolution.

From U.S. Pat. No. 5,892,224, US 2002/0148961 A1, US 2002/0142496 A1, US 2002/0130262 A1, US 2002/0109090 A1, US 2002/0033449 A1, US 2002/0028399 A1, electron microscopy apparatus are known which use a plurality of primary electron beamlets focused onto the surface of the object to be inspected. The beamlets are generated by a multi-aperture plate having a plurality of apertures formed therein, wherein an electron source generating a single electron beam is provided upstream of the multi-aperture plate for illuminating the apertures formed therein. Downstream of the multiple-aperture plate a plurality of electron beamlets is formed by those electrons of the electron beam that pass the apertures. The plurality of primary electron beamlets is focused on the object by an objective lens having an aperture, which is passed by all primary electron beamlets. An array of primary electron spots is then formed on the object. Secondary electrons emanating from each primary electron spot form a respective secondary electron beamlet, such that a plurality of secondary electron beamlets corresponding to the plurality of primary electron beam spots is generated. The plurality of secondary electron beamlets also pass the objective lens, and the apparatus provides a secondary electron beam path such that each of the secondary electron beamlets is supplied to a respective one of a plurality of detector pixels of a CCD electron detector. A Wien-filter is used for separating the secondary electron beam path from a beam path of the primary electron beamlets.

Since one common primary electron beam path comprising the plurality of primary electron beamlets and one common secondary electron beam path comprising the plurality of secondary electron beamlets is used, one single electron-optical column may be employed, and the density of primary electron beam spots formed on the object is not limited by a foot step size of the single electron-optical column.

The number of primary electron beam spots disclosed in the embodiments of the above-mentioned documents is in the order of some ten spots. Since the number of primary electron beam spots formed on the object at the same time limits the throughput, it is desirable to increase the number of primary electron beam spots in order to achieve a higher throughput. It has been found, however, that it is difficult to increase the number of primary electron beam spots formed at the same time, or to increase a primary electron beam spot density, employing the technology disclosed in those documents while maintaining a desired imaging resolution of the electron microscopy apparatus.

What has been described above with reference to electrons applies in a similar manner to other charged particles.

It is therefore an object of the present invention to provide an objective lens arrangement as well as a particle-optical system having improved particle-optical properties.

SUMMARY OF THE INVENTION

The present invention is applicable to particle-optical systems using multiple beamlets of charged particles; the present invention is, however, not limited in the application to systems using multiple beamlets, but is equally applicable to particle-optical systems using only one single beam of charged particles.

According to a first aspect, the present invention provides an objective lens arrangement having an object plane and an axis of symmetry and comprising first, second and third pole pieces which are substantially rotationally symmetric with respect to an axis of symmetry and which are disposed on a same side of the object plane. The first, second and third pole pieces extend towards the axis of symmetry such that radial inner ends of the first, second and third pole pieces each define a bore which is to be traversed by a beam path of one or more beams of charged particles. A radial inner end of the first pole piece is disposed at a distance from a radial inner end of the second pole piece to form a first gap between them, and a radial inner end of the third pole piece is disposed at a distance from the radial inner end of the second pole piece to form a second gap between them.

The axis of symmetry referred to above generally coincides with the optical axis of a particle-optical system the objective lens arrangement is comprised in, such that the two terms are used to the same effect herein. The objective lens arrangement may also be described as having a central axis which may or may not also be an axis of symmetry, which central axis generally coincides with the optical axis of a system the objective lens arrangement is comprised in and thus also be used synonymously to the term optical axis.

A first excitation coil is provided for generating a magnetic field in a region of the first gap, and a second excitation coil is provided for generating a magnetic field in a region of the second gap. A first power supply is provided for supplying an excitation current to the first excitation coil, and a second power supply is provided for supplying an excitation current to the second excitation coil. The first and second power supplies may be two portions of a same power supply. The first and second power supplies are configured to supply currents to the first and second excitation coils and thus generate excitation currents such that a magnetic flux generated by the first excitation coil in the second pole piece is oriented in the same or a different direction as a magnetic flux generated by the second excitation coil in the second pole piece.

Generally, the first excitation coil is disposed between the first and second pole pieces and the second excitation coil disposed between the second and third pole pieces.

Depending on a shape, configuration and position of the pole pieces, a position and configuration of the excitation coil and an excitation current, the magnetic field generated in a region of the gap may have different magnetic field strengths and different dimensions. For instance, the magnetic field may extend only over a region close to the gap or may extend as far as the object plane. Since magnetic lenses are usually employed in inspection optical systems to provide a focusing effect, a magnetic focusing field generally extends as far as the object plane in order to achieve a good focusing effect, avoid defocusing before the object plane and avoid particle-optical aberrations.

The objective lens arrangement according to the first aspect of the present invention allows adjusting the magnetic fields in the first and second gaps such that the magnetic field in the first gap provides a focusing effect on the one or more beams of charged particles traversing the focusing magnetic field whilst the magnetic field generated in the second gap is configured to compensate for the focusing magnetic field extending from the first gap to locations on or at least close to the object plane.

The first and second gaps may be disposed at an angle to one another, for instance. The angle formed between the first and second radial gaps may be in a range of from 10 to about 170 degrees, for instance, and may be in a range of from 45 to 135 degrees or from 60 to 120 degrees, by way of example. In other words, in this exemplary embodiment, the first gap is disposed at an angle to the axis of symmetry that is different from an angle formed between the second gap and the axis of symmetry. For purposes of determining an angle between gaps, a straight line connecting the radial inner ends of the respective pole pieces forming the gap may be employed to represent the gap.

In an exemplary embodiment, the first gap is oriented substantially in an axial direction, i.e. substantially parallel or at a relatively small angle to the axis of symmetry, and thus forms an axial gap. An axial gap does not necessarily imply that radial innermost ends of the pole pieces forming the gap need to have the same distance from the axis of symmetry, but also encompasses those embodiments wherein the innermost ends have different distances from the axis of symmetry and wherein the gap formed between points on radial inner ends of the pole pieces that are disposed closest to one another form an angle of less than 45°, for instance less than 30° or less than 15° to the axis of symmetry. The second gap may be oriented substantially in a radial direction with respect to the objective lens arrangement, i.e. orthogonal to the axis of symmetry and thus form a radial gap. Radial gaps also encompass those embodiments wherein the gap defined by a closest distance (straight line along the closest distance) between the inner radial ends of the pole pieces is disposed at an angle of from about 50° to 90° to the axis of symmetry, such as from about 80° to 90° to the axis of symmetry.

According to an exemplary embodiment, the focusing magnetic field (generated in the first gap) is compensated for by the magnetic field generated in the second gap to such an extent that a total magnetic field in a region on the object plane and about the optical axis is substantially zero, in other words, the compensating magnetic field substantially cancels the focusing magnetic field in a region on the object plane.

Such a configuration allows obtaining advantageous imaging properties with the objective lens arrangement. In particular, an image rotation caused by the focusing magnetic field may be eliminated in the vicinity of the object plane. This allows achieving improved overall performance of the system, in particular with regard to structured objects, which are inspected and/or processed using the objective lens arrangement.

The configuration of, in particular, the embodiment with the first gap being an axial gap and the second gap being a radial gap is particularly advantageous, since the pole pieces can be arranged such that the radial inner end of the second pole piece is disposed close to the object plane such that the focusing magnetic field is also generated and disposed close to the object plane. On the other hand, having a radial gap formed between the inner radial end of the second pole piece, which also defines the lower end of the first gap, and the third pole piece allows the radial gap to be disposed close to the first gap and the focusing magnetic field to be generated close to the object plane, thus providing the magnetic field compensating effect in very close vicinity to the object plane. The radial orientation of the second gap also allows generating the compensating magnetic field downstream of the objective lens arrangement thus not interfering with the focusing magnetic field inside the objective lens arrangement and thus not impairing a focusing effect provided thereby. This embodiment thus advantageously allows the major portion of the focusing magnetic field to remain unaffected and enables the compensating field to take effect on/close to the object plane.

Therefore, in exemplary embodiments, the radial inner end of the third pole piece and the radial inner end of the second pole piece are disposed in substantially a same plane, which plane is disposed substantially parallel to the object plane.

In a further exemplary embodiment, the objective lens arrangement may additionally comprise a fourth pole piece which is substantially rotationally symmetric with respect to the axis of symmetry, wherein a third gap is formed between the fourth pole piece and the first pole piece, and wherein the third gap is disposed at a greater distance from the object plane than the first gap; and a third excitation coil for generating an adjusting magnetic field in the third gap.

The adjusting magnetic field may be used to adjust the focusing magnetic field in terms of its strength, location, dimension and other parameters. The adjusting magnetic field may be used to increase or decrease the focusing magnetic field strength, for instance. The fourth gap may be an axial gap, for example. The inner radial end of the fourth pole piece may be disposed at a distance from the axis of symmetry that is greater, equal to or smaller than a distance between the radial inner end of the first pole piece and the axis of symmetry, for instance.

The pole pieces may be disposed and configured such that, for instance, the second and third pole pieces are electrically connected to each other and the first pole piece is electrically insulated from the second and third pole pieces, such as by an insulating layer.

In those exemplary embodiments, the insulating layer may be provided between an outer cylindrical portion of or integrally formed with the first pole piece and a substantially cylindrical yoke formed by and connecting the second and third pole pieces. The outer cylindrical portion may extend around and substantially parallel to the yoke as well as the axis of symmetry, for example, such that the insulating layer also extends substantially in an axial direction. In addition or alternatively, the first pole piece may comprise an annular, substantially disc-shaped or disc-like portion or have an annular disc-shaped or disc-like portion integrally formed with it. In those exemplary embodiments, the insulating layer may be provided between the outer annular disc shaped portion integrally formed with the first pole piece, and an outer portion of the second pole piece. In those exemplary embodiments, the annular disc-shape or disc-like portion and the outer portion are arranged to have parallel surfaces over at least a portion thereof.

In further exemplary embodiments, the first pole piece comprises an inner member and an outer member, that is comprises two distinct parts, with the inner and outer members being electrically insulated from one another by an insulating layer. Inner and outer, as used herein, refer to a radial distance from the axis of symmetry, i.e. a distance from the axis of symmetry in a plane orthogonal to the axis of symmetry. In those exemplary embodiments, an additional insulating layer may be provided between the outer member of the first pole piece and an outer portion of the second pole piece. The outer member of the first pole piece in this exemplary embodiment of the objective lens arrangement according to the present invention may be configured to accommodate the first excitation coil. The inner member of the first pole piece may comprise or consist of a substantially conical portion extending towards the axis of symmetry. The outer member may have or comprise a substantially annular shape, for instance.

According to a second aspect, the invention provides an objective lens arrangement having an object plane and an axis of symmetry and comprising first and second pole pieces which are rotationally symmetric with respect to the axis of symmetry, with inner ends of the first and second pole pieces defining respective bores which are configured to be traversed by a beam path of one or more beams of charged particles. The radial inner end of the first pole piece is disposed at a distance from the radial inner end of the second pole piece to form a (first) gap between them, with the second pole piece being disposed closer to the object plane than the first pole piece. The first and second pole pieces are electrically insulated from each other. A first excitation coil is provided for generating a focusing magnetic field in the first gap, and a beam tube extends through the bore formed by the radial inner end of the first pole piece.

The objective lens arrangement according to the second aspect further comprises an object mount for mounting an object to be processed such that the object is disposed in the object plane. The object mount includes an electrical connector for supplying an electrical voltage to the object to be processed.

As used herein, "object to be processed" is to be understood as encompassing objects that are inspected, imaged and/or manipulated by a charged particle beam or a plurality of charged particle beamlets.

The objective lens arrangement according to the second aspect of the present invention further comprises a first voltage source configured for supplying a voltage to the beam tube such that the beam tube is more than about 15 kV above ground potential. A second voltage source is provided and configured for supplying a voltage to the electrical connector such that the electrical connector is grounded or below ground potential. In exemplary embodiments, the second voltage source may be configured to supply a voltage such that the electrical connector is more than about 15 kV below ground potential.

In exemplary embodiments, the objective lens arrangement according to the second aspect of the present invention further comprises a third voltage source configured for supplying a voltage to the second pole piece such that a potential of the second pole piece is from about 0.1 kV to about 10 kV above a potential of the electrical connector. The first through third voltage sources may be individual voltage sources or portions of a same voltage source.

Such an arrangement allows to obtain advantageous optical properties of an electron microscopy system, for instance, using the objective lens arrangement since a primary electron beam having a particularly high kinetic energy may be generated and formed by beam shaping components of the electron microscopy system, and the primary electrons of the beam are decelerated to desired kinetic energies only shortly above the object plane, thus greatly reducing Coulomb interactions between the primary electrons. Further, an electrical field generated between the object disposed in the object plane and the second pole piece will accelerate secondary electrons emanating from the object.

In exemplary embodiments, voltages supplied by the first or second voltage sources include voltages which may be equal to or higher than 20 kV, 25 kV, 30 kV and may be equal to or higher than 45 kV, for instance.

The voltage supplied by the third voltage source may be an adjustable voltage, for instance, which allows precise adjustment of an electrical field immediately above the object plane to a desired value. Likewise, in exemplary embodiments, the first and/or second voltage sources may be adjustable voltage sources.

In an exemplary embodiment, the beam tube is electrically insulated from the first pole piece.

In further exemplary embodiments, the first pole piece is substantially at ground potential.

According to a further exemplary embodiment, the third voltage source has one of its connectors connected to the second pole piece and another of its connectors connected to the electrical connector of the object mount, i.e. is connected to both the second pole piece and the electrical connector.

In a further exemplary embodiment, the first pole piece is electrically insulated from the second and third pole pieces by a thin insulating layer. In advantageous embodiments thereof, a large area of overlap is provided between the first pole piece on one side and the second or third pole pieces on the other side, in other words a large area is provided in which opposite surfaces of the respective pole pieces are arranged in the vicinity of one another and preferably parallel or nearly parallel to one another. This allows for a sufficient electrical insulation between the first pole piece and the second and third pole pieces whilst maintaining a sufficiently low magnetic resistance for generating the focusing magnetic field in the first gap.

Generally, in those exemplary embodiments, the insulating layer is preferably provided between an outer portion of the first pole piece and an outer portion of the second pole piece.

In those exemplary embodiments wherein the first pole piece has an integrally formed outer cylindrical portion, the insulating layer is preferably provided between the cylindrical portion of the first pole piece and an outer portion of the second pole piece.

In further exemplary embodiments of the objective lens arrangement according to the second aspect, the objective lens arrangement may further comprise a third pole piece having a radial inner end which is disposed at a distance from the radial inner end of the second pole piece to form a second gap, wherein the first pole piece is electrically insulated from both the second and third pole pieces by an insulating layer.

Embodiments and features of the objective lens arrangement according to the first aspect are equally applicable to the objective lens arrangement according to the second aspect.

In further exemplary embodiments, the first pole piece comprises an inner member and an outer member, that is two separate parts, with the inner and outer members being electrically insulated from each other by an insulating layer. The outer member would then also comprise the outer portion of the pole piece that is generally disposed to face the outer portion of the second pole piece. In exemplary embodiments, the outer member of the first pole piece is configured to accommodate the first excitation coil and the inner member of the first pole piece comprises a substantially conical portion extending towards the axis of symmetry. These embodiments are particularly advantageous when the inner member of the first pole piece is disposed adjacent to the beam tube and electrically connected thereto.

Dividing the first pole piece into an inner member and an outer member and electrically connecting the inner member and the beam tube extending through the bore formed by the inner member has the advantage that provision of electrical power to the beam tube is facilitated. Rather than having to provide electrical wiring to the beam tube itself, the electrical power is provided via the inner member of the pole piece, which is more easily accessible for electrical connections. In addition, dividing the first pole piece into two members and electrically insulating the two members from one another saves the provision of an electrically insulating layer between the beam tube and the first pole piece, which tends to require a complex layout to avoid creep currents and the like.

In a third aspect, the invention provides an objective lens arrangement, comprising a second pole piece and a third pole piece, wherein the second and third pole pieces are substantially rotationally symmetric with respect to an axis of symmetry, wherein the second and third pole pieces are disposed on a same side of an object plane of the objective lens arrangement, wherein a radial inner end of the third pole piece is disposed at a distance from a radial inner end of the second pole piece to form a second gap, and wherein the second and third pole pieces are electrically connected to each other; a second excitation coil for generating a magnetic field in the second gap; and a second power supply configured for supplying an excitation current to the second excitation coil, wherein the second power supply is substantially at ground potential; and a third voltage source configured for supplying a voltage to the second pole piece such that the second pole piece is at a potential differing from a potential of the second excitation coil by more than about 15 kV, in particular more than 20 kV, in particular more than 25 kV, and in particular more than 30 kV.

The pole pieces of the objective lens arrangement according to this aspect of the invention are denoted "second" and "third" pole pieces (rather than "first" and "second") simply for sake of clarity and easier reference to other embodiments and aspects of the present invention as described herein, the same applies to the numbering of the power supplies.

In this configuration, the second pole piece may be advantageously used for shaping the electrical field in a region close to the object plane whilst, at the same time, avoiding to operate the power supply for supplying the excitation current to the second excitation coil at a high electrical potential.

In exemplary embodiments, the objective lens arrangement according to the third aspect of the present invention further comprises: a first pole piece, wherein the first pole piece is substantially rotationally symmetric with respect to the axis of symmetry, wherein the first pole piece is disposed on the same side of the object plane of the objective lens arrangement as the second and third pole pieces, wherein a radial inner end of the first pole piece is disposed at a distance from the radial inner end of the second pole piece to form a first gap, and wherein the first pole piece is electrically insulated from the second and third pole pieces, wherein the third voltage source is further configured to supply the voltage to the second pole piece such that the second pole piece is at a potential differing from a potential of the first pole piece by more than about 15 kV, in particular more than 20 kV, in particular more than 25 kV, and in particular more than 30 kV; and a first excitation coil for generating a magnetic field in the first gap.

According to a further exemplary embodiment, a cooling system is provided which includes a cooling medium supply for supplying a cooling medium to the second excitation coil. Advantageously, the cooling medium supply may be set to ground potential or near ground potential. The cooling medium may be water, for instance.

According to a fourth aspect of the present invention, an objective lens arrangement is provided comprising a second pole piece and a third pole piece, wherein the second and third pole pieces are substantially rotationally symmetric with respect to an axis of symmetry, wherein the second and third pole pieces are disposed on a same side of an object plane of the objective lens arrangement, wherein a radial inner end of the third pole piece is disposed at a distance from a radial inner end of the second pole piece to form a second gap, wherein the second and third pole pieces are electrically connected with each other. The objective lens arrangement according to the fourth aspect further comprises a second excitation coil for generating a magnetic field in the second gap; and a third voltage source configured for supplying a voltage to the second pole piece such that the second pole piece is at a potential differing from a potential of the compensating coil by more than about 15 kV, in particular more than 20 kV, in particular more than 25 kV, in particular more than 30 kV, and in particular more than 45 kV.

The second excitation coil of the objective lens according to this aspect of the present invention comprises a plurality of windings of an insulated wire, and at least one further insulating layer is provided for supporting the second excitation coil with respect to at least one of the second and third pole pieces.

Such further insulating layer, which is different from an insulating layer surrounding a wire forming the individual windings, allows to efficiently insulate the whole body of the second excitation coil from the second and third pole pieces and thus allows a power supply for supplying the second excitation coil with a suitable current to be maintained at a potential different from the potential of the second and third pole pieces.

The insulating layer may be made from ceramic material or cast resin, for instance.

The pole pieces of the objective lens arrangement according to this aspect of the invention are, in analogy to the third aspect, denoted "second" and "third" pole pieces (rather than "first" and "second") simply for sake of clarity and easier reference to other embodiments and aspects of the present invention as described herein. This applies likewise to the voltage source(s).

In an exemplary embodiment, the objective lens arrangement according to the fourth aspect further comprises a first pole piece, wherein the first pole piece is substantially rotationally symmetric with respect to the axis of symmetry, wherein the first pole piece is disposed on the same side of the object plane of the objective lens arrangement as the second and third pole pieces, wherein a radial inner end of the first pole piece is disposed at a distance from the radial inner end of the second pole piece to form a first gap, and wherein the first pole piece is electrically insulated from the second and third pole pieces, wherein the third voltage source is further configured to supply the voltage to the second pole piece such that the second pole piece is at a potential differing from a potential of the first pole piece by more than about 15 kV, in particular more than 20 kV, in particular more than 25 kV, and in particular more than 30 kV; and a first excitation coil for generating a magnetic field in the first gap.

In a fifth aspect, the present invention provides an objective lens arrangement comprising an object mount for mounting an object to be processed such that the object is disposed in an object plane of the objective lens arrangement, wherein the object mount includes an electrical connector for delivering an electrical voltage to the object. The objective lens arrangement further comprises a pole piece, which is referred to as the third pole piece in line with the terminology of the other aspects of the present invention, which third pole piece is substantially rotationally symmetric with respect to an axis of symmetry of the objective lens arrangement and which extends substantially transversely to the axis of symmetry. A voltage source, referred to in the following as the third voltage source, is provided and configured for supplying a voltage to the third pole piece such that the third pole piece is at a potential differing from a potential of the electrical connector by from about 0.1 kV to about 10 kV. The objective lens arrangement further comprises a shielding electrode which is disposed between the third pole piece and the object plane, and which is electrically insulated from the third pole piece.

The voltage applied to the third pole piece serves to generate an electrical field on a surface of the object in a region where it is being processed, whereas the provision of the shielding electrode allows to shield regions of the object outside of the region being processed from said electrical field. This shielding effect thus allows avoiding or reducing charging effects on the object.

According to an exemplary embodiment, the shielding electrode is electrically connected to the electrical connector of the object mount such that substantially no electrical field is present in the space between the object plane and the shielding electrode.

According to a further exemplary embodiment, the shielding electrode substantially has a ring-shape with an inner aperture, which is substantially concentric with the optical axis of the system or the axis of symmetry of the objective lens arrangement, respectively.

The third pole piece has a surface facing in a direction of the object mount. In exemplary embodiments, the third pole piece has a radial inner annular portion in which said surface extends substantially parallel to the object plane at a first distance from the object plane, and a radial outer annular portion in which the surface extends substantially parallel to the object plane at a second distance from the object plane, wherein the second distance is greater than the first distance. The radial inner annular portion has a radial inner end which may coincide with the inner peripheral edge of the third pole piece, and a radial outer end which may coincide with the surface of the third pole piece which is disposed at a different angle to the object plane than the inner angular portion. Hence, the inner annular portion is disposed closer to the object plane than the outer annular portion. Furthermore, in this exemplary embodiment, the shielding electrode has an inner aperture, which may be concentric about the axis of symmetry of the third pole piece, as described above, wherein the inner annular portion of the third pole piece is disposed and configured such that its radial outer end is disposed within the inner aperture of the shielding electrode. In other words, in this exemplary embodiment, a diameter of the inner aperture is greater than a diameter of the inner annular portion of the third pole piece such that the inner annular portion may be contained entirely within the inner aperture of the shielding electrode, and the inner annular portion may be disposed in a same plane as the shielding electrode. Thus, the shielding electrode would also be disposed at about the first distance from the object plane. In those exemplary embodiments, the second distance of the outer annular portion of the third pole piece would need to be chosen such that it permits the shielding electrode to be arranged in the same plane and a gap to be kept in between the third pole piece, in particular in a region of the annular outer portion, and the shielding electrode In those exemplary embodiments, the inner annular portion and the outer annular portion may be disposed immediately adjacent one another, such that the surface of the third pole piece (facing the object plane) would have a step to accommodate the transition from the first to the second distance, or the inner and outer annular portions may be joined to one another by a middle annular portion disposed at an angle to the object plane to accommodate the transition from the first to the second distance. The middle annular portion could be relatively small compared to the other annular portions, for instance, such that most of the surface of the third pole piece opposite the object would be disposed substantially parallel to the object plane, such that in those embodiments, the third pole piece would comprise a small bend in the middle annular portion.

Substantially parallel, as used in this context, shall also comprise those embodiments wherein the surface of the radial outer annular portion is disposed at an angle of up to 30°, for instance, or up to 20° in a further example, with respect to the object plane and/or wherein the radial inner annular portion is disposed at an angle of up to 20° with respect to the object plane, or up to 10° in another example.

The objective lens arrangement according to this aspect of the present invention may also comprise additional components and features as described herein in connection with the other aspects of the present invention. In particular, in exemplary embodiments, the objective lens arrangement further comprises a second pole piece, wherein a radial inner end of the third pole piece and a radial inner end of the second pole piece form a gap between them. In further exemplary embodiments, the second pole piece has an inner angular portion with a surface facing the third pole piece and the third pole piece has an angular portion with a surface facing the second pole piece, wherein the surfaces of the third and second pole pieces facing each other form an angle of less than 40°, for instance less than 35° between them. The gap may be a substantially radial gap. In yet further exemplary embodiments, the second pole piece has a inner annular portion wherein the surface facing the third pole piece is disposed at an angle of from between about 3° to about 35° with respect to the surface of the inner annular portion of the third pole piece facing the second pole piece.

According to a sixth aspect of the present invention, an objective lens arrangement is provided which comprises an object mount for mounting an object to be processed in an object plane, and first and second pole pieces which are substantially rotationally symmetric with respect to an axis of symmetry of the objective lens arrangement. The first and second pole pieces extend towards the axis of symmetry such that radial inner ends of the first and second pole pieces define bores which are configured to be traversed by one or more beams of charged particles. A first excitation coil is provided for generating a focusing magnetic field in a first gap formed between the radial inner end of the first pole piece and the radial inner end of the second pole piece. A beam tube configured for guiding the one ore more beams of charged particles extends through the bore formed by the radial inner end of the first pole piece. In embodiments according to this aspect, the bore of the first pole piece generally extends from a first plane where a diameter of the bore is a minimum diameter to a second plane in which a front surface portion of the first pole piece is disposed. The diameter of the bore increases from its minimum diameter in the first plane to a front diameter in the second plane by more than about 10 mm, wherein a distance between the first and second planes is more than about 5 mm, thus resulting in a tapering shape.

Such a tapering or conical shape of the first pole piece allows shaping a distribution of a magnetic field strength on the axis of symmetry, which generally coincides with an optical axis of a particle-optical system, such that desired optical properties of the objective lens may be achieved.

According to a seventh aspect of the present invention, a charged particle beam system is provided which comprises a charged particle source for generating a beam of charged particles, at least one beam shaping lens configured to be traversed by the charged particles and an objective lens configured to be traversed by the charged particles, wherein the objective lens has an axis of symmetry and an object plane associated therewith.

The at least one beam shaping lens and the objective lens are configured such that an average direction of incidence of charged particles, which average direction of incidence may be defined as an average over all directions from which charged particles are incident at a respective location of the object plane, is oriented away from the optical axis in a ring-shaped inner portion of the object surrounding the optical axis, and such that the average directions of incidence at locations within a ring-shaped outer portion of the portion of the object plane surrounding the ring-shaped inner portion are oriented towards the optical axis.

Such a configuration allows to reduce a third order telecentricity error in the object plane by a substantial amount.

According to an exemplary embodiment, a maximum average angle $\theta_i$ of the average angles of incidence at the location within the ring-shaped inner portion relates to a maximum average angle $\theta_o$ of the average angles of incidence at the locations within the ring-shaped outer portion as defined by the following equation:

$$0.5 < \frac{|\theta_i|}{|\theta_o|} < 2.$$

In an exemplary embodiment, the maximum average angle $\theta_i$ differs from the maximum average angle $\theta_o$ by at most 30% of the absolute value of the maximum average angle $\theta_o$, for instance at most 20%. It may even differ by as little as 15% or less or even 10% or less.

According to a further exemplary embodiment, the maximum average angle of the average angles of incidence at the locations within the ring-shaped outer portion is more than about 1 mrad.

Such a configuration may be advantageously put into practice using an objective lens arrangement that includes a pole piece having a tapering shape, as described above. A further advantage of such a configuration is that it allows reducing a field curvature associated with the objective lens arrangement.

According to an eighth aspect of the present invention, an objective lens arrangement is provided, which comprises an object mount for mounting an object to be processed in an object plane, a first electrode disposed at a distance from the object plane and having an aperture of a first diameter which is concentric with an axis of symmetry of the objective lens arrangement, and a second electrode disposed at a second distance from the object plane and in between the first electrode and the object plane, and having an aperture of a second diameter, which aperture is concentric to the axis of symmetry.

A first voltage supply is connected to the first electrode and may be configured and operated such that the first electrode is set to a first potential relative to the object to be processed, and a second voltage supply is connected to the second electrode and may be configured and operated such that the second electrode is set to a second potential relative to the object to be processed.

The first and second distances, the first and second diameters and the first and second voltages are adjusted such that a contribution of the first electrode to an electrical field generated immediately above the object plane is of a same order of magnitude as a contribution of the second electrode to said electrical field. The contributions of the first or second electrodes to the generated electrical field may be assessed and tested by comparing two settings, a first and a second setting.

In the first setting, the first electrode is at the first potential relative to the electrical connector and thus the object and the second electrode is at the same potential as the electrical connector. In the second setting, the first electrode is at the first potential relative to the electrical connector and the second electrode is at the same potential as the first electrode.

According to an exemplary embodiment, the following relation is fulfilled:

$$\frac{(E_1 - E_2)}{2 \cdot (E_1 + E_2)} < 0.3,$$

wherein $E_1$ is the electrical field at the object plane in the first setting, and $E_2$ is the electrical field at the object plane in the second setting.

In exemplary embodiments, the above defined ratio $(E_1-E_2)/2(E_1+E_2)$ may be equal to or smaller than 0.2, or be equal to or smaller than 0.1, or be equal to or smaller than 0.05.

This aspect applies in particular to electron beam systems. A configuration wherein this relation is fulfilled is particularly advantageous when a large aperture of the electrode adjacent to the object plane generating the electrical field in the object plane and a correspondingly large electrical field in the object plane are applied. A homogenous electrical field in the region of the object plane provides a homogeneous extraction field for secondary electrons, which is likely to result in improved secondary electron yield and/or good aberration coefficients for the secondary electrons.

According to a ninth aspect, the present invention provides a particle-optical inspection system comprising: an objective lens arrangement comprising a first pole piece and a second pole piece, wherein the first and second pole pieces are substantially rotationally symmetric with respect to an axis of symmetry, wherein a radial inner end of the first pole piece is disposed at a distance from a radial inner end of the second pole piece to form a first gap between them, wherein the first pole piece has an inner portion extending at an angle towards the axis of symmetry and wherein the first and second pole pieces are electrically insulated from each other; a first excitation coil for generating a focusing magnetic field in a region of the first gap; a beam tube extending through a bore formed by the radial inner end of the first pole piece; and a first voltage source configured for supplying a voltage to the beam tube; with the particle-optical inspection system further comprising a beam path splitting arrangement comprising at least one magnetic field arrangement, wherein a lower end of the at least one magnetic field arrangement of the beam path splitting arrangement is disposed at a first distance from the object plane and wherein an upper end of the first excitation coil is disposed at a second distance from the object plane and wherein the first distance is shorter than the second distance. In other words, the beam path splitting arrangement is at least partially inserted into the objective lens arrangement.

Lower as used above indicates a direction with respect to the object plane, i.e. lower indicates a closer distance to the object plane than upper.

Beam splitting arrangements are advantageously used in multi-beam inspection systems, such as described for instance in WO 2005/024881 A2 (U.S. provisional application Ser. No. 60/500,256) to the same Assignee, the entire content of which is incorporated by reference herein. A beam splitting arrangement will be described in detail with reference to the drawings.

It has been found to be favorable for the beam path splitting arrangement to be disposed close to the object plane. In conventional systems employing a beam splitting arrangement, this arrangement is typically disposed upstream of the objective lens arrangement without any overlap between these two components. In contrast thereto, according to this aspect of the present invention, a lower portion of the beam splitting arrangement, i.e. the portion of the beam splitting arrangement disposed closest to and facing the object plane, is practically inserted into the objective lens arrangement. This is particularly advantageous in inspection systems using electrons as charged particles since an image of secondary electrons generated by electrons impinging on the object to be inspected is usually formed closely above the object plane. Insertion of the beam splitting arrangement into the objective lens arrangement thus allows shortening a path between the image of secondary electrons and a nearest focusing optical element of the inspection system and thus enables enhanced inspection performance.

In exemplary embodiments of the inspection system according to this aspect of the present invention, the inner portion of the first pole piece extends towards the axis of symmetry such that the radial inner end of the first pole piece is disposed closer to the object plane than a radial outer end of the inner portion of the first pole piece and thus allows the lower end of the at least one magnetic field arrangement to be disposed within a bore or space defined by the inner portion of the first pole piece.

In this embodiment, the particle-optical inspection system may further comprise a mounting structure, that may be attached to the first pole piece, for mounting the magnetic field arrangement of the beam path splitting arrangement or, more generally, a lower portion of the beam path splitting arrangement. The mounting structure may also allow adjusting a position of the magnetic field arrangement of the beam splitting arrangement relative to at least the first pole piece.

For instance, the inner portion of the first pole piece may have a substantially conical shape with the radial inner end of the first pole piece being disposed closer to the object plane than a radial outer end thereof, and with the lower end of the magnetic field arrangement being disposed inside the conus formed by the inner portion of the first pole piece. In those embodiments, the conus formed by the inner portion of the first pole piece may having a conus opening angle $\alpha$ in a range of from 20° to about 70°, for example.

In other exemplary embodiments, the inner portion may comprise two substantially cylindrical shapes with a lower of the two cylinders forming a bore having a smaller diameter than an upper cylinder. In those embodiments, the lower portion of the beam path splitting arrangement may be disposed at least partially within the bore formed by the upper cylinder. However, it is not necessary for the bore of the lower cylinder to be smaller, it may also be greater or may be the same as the bore of the upper cylinder. Other configurations are also possible and will be readily apparent to the person skilled in the art.

Even without explicit mentioning, it will be apparent to the skilled person that individual features or combinations of features of embodiments of the objective lens arrangements and systems described herein in connection with a particular aspect of the present invention may also be applied in embodiments of the objective lens arrangements and systems of the other aspects of the invention.

In exemplary embodiments, the objective lens arrangements according to the present invention may further comprise a heating system disposed within at least one excitation coil, the heating system comprising a heating coil disposed in the vicinity of the at least one excitation coil and a control portion for controlling and adjusting a current passing through the heating coil. The at least one excitation coil may be the first, second and/or third excitation coil of the embodiments described above. For instance, the heating coil may be disposed within the excitation coil, i.e. in a cavity within the excitation coil, or be interlaced therewith. In particular, the control portion may be configured to adjust the current passing through the heating coil in dependence of at least one of a current passing through the at least one excitation coil (excitation current), for instance the at least one of the first, second and third excitation coils, a temperature of at least one of the first, second and third pole pieces, as desired and applicable. Furthermore, a temperature sensor may be provided in those embodiments for sensing the temperatures of at least one of the first, second and third pole pieces. The sensed temperature may then be transmitted to the control portion to control a current provided by the power supply to the heating coil. This embodiment has the advantage that a temperature of one or more pole pieces may be kept substantially constant. Thus, disturbances caused by heating of the pole pieces, which may lead to an expansion of the pole piece material and thus an undesirable change of the dimensions and geometry of the objective lens arrangement, may be avoided. Heating of the pole pieces may result from prolonged operation of the objective lens system and may also result from a change of application and thus a change of focusing power and associated change of excitation current. This embodiment allows keeping a magnetic field and thus focusing characteristics of the objective lens arrangements constant and well controllable. In an alternative embodiment, the heating coil may take a shape of an only nearly closed ring about the axis of symmetry, i.e. an incomplete circle wherein ends thereof do not touch. This embodiment is advantageous in that undesired magnetic fields that might be generated by the heating coil can be avoided.

Use of a cooling system for cooling in particular the second excitation coil has already been described above in connection with the third aspect of the present invention. Rather than use of a fluid cooling medium, other embodiments of the objective lens arrangements according to any of the aspects of the present invention may make use of a cooling system based exclusively on solid-state materials for conducting away heat generated in particular by the excitation coils.

In an exemplary embodiment, which is explained in the following with reference to the second excitation coil but may also be applied to any other excitation coil, the second and third pole pieces are substantially integrally formed and connected by a yoke, and accommodate the second excitation coil between them in a region of their outer annular regions. The excitation coil generally comprises a number of windings of an insulated wire, which is connected to a power supply. In this embodiment, at least an outer side of a body of the excitation coil formed by the wire windings is at least partially encapsulated by one ore more layers of thermally well conducting and electrically insulating ceramic material. This ceramic encapsulation is connected to or integrally formed with connecting members made of the same or a similar material that extends through portions of the yoke connecting the second and third pole pieces. Those connecting portions may be distributed at regular intervals around a circumference of the yoke to establish a thermally conducting contact to a ring of thermally well conducting solid material disposed around and adjacent to the radial outer end of the yoke. The ring of thermally well conducting material may be made from ceramic material, copper or comprise both a ring of ceramic material and a ring of copper that are in contact with one another. Those rings are connected, preferably via copper wire, to a cooling system further remote from the second and third pole pieces, which may be a cooling system based on liquid cooling, for instance. The solid-state cooling system has the advantage that insulating the cooling system from the high voltage parts comprised in the objective lens arrangements is easier to achieve than in the case of liquid cooling. This embodiment has therefore the advantage that no electrically conductive material is introduced into the vicinity of the excitation coil inside the pole piece. It will be apparent to the person skilled in the art that other suitable thermally well conductive materials may be used and that this kind of cooling system may also be used for the first and second pole pieces or any other parts of the system that may require cooling.

In a further exemplary embodiment of the present invention, in particular in connection with the above-described type of solid-state cooling system, the objective lens arrangement according to the present invention may further comprise an adjustable mounting structure for mounting the second and third pole pieces. The mounting structure allows adjusting a position of the second and third pole pieces in particular relative to the first pole piece. The adjustable mounting structure may comprise, for instance, a mounting ring disposed around the yoke connecting the first and second pole pieces and fixedly attached thereto. In an exemplary embodiment, the mounting ring is held in place by three or more wires, or flexible elements, more generally. Lower ends of the wires are fixed to the mounting ring, for instance, preferably at points spaced equally about a perimeter of the mounting ring, and upper ends of the wires are advantageously attached to one or more components upstream of the second and third pole pieces, such as the first pole piece. This mounting structure allows holding the second and third pole pieces in place without the need for any bulky holding components. Thus, the second and third pole pieces may be held entirely in a vacuum environment. A position of the second and third pole pieces, in particular relative the first pole piece, may be adjusted by suitable shortening or lengthening one or more of the wires, as required.

In further exemplary embodiments, the adjustable mounting structure further comprises a fine adjustment arrangement. The fine adjusting arrangement may comprise, for instance, a mechanism for adjusting an axial position of the mounting ring, or the second and third pole pieces, more generally, and a mechanism for adjusting a radial position of the mounting ring, or the second and third pole pieces, more generally, in the objective lens arrangement or a combination of the two.

The mechanism for adjusting an axial position of the mounting ring and thus the second and third pole pieces may comprise a screw having one end attached to a component of the objective lens arrangement which has a fixed or fixable position, with the screw having a winding which is connected to the mounting ring such that turning of the screw results in a change of an axial position thereof. For instance, turning the screw may lift or lower the mounting ring relative to other components of the objective lens arrangement, such as the first pole piece, for instance.

An adjustment mechanism for adjustment of a radial position may be provided by an arrangement comprising a combination of a wedge-shaped member, a bearing comprising a chamber with two balls inside, and a screw. The chamber and the balls are configured such that the balls touch each of four side walls of the chamber, the chamber being open to one side such that a pointed side of the wedge can be arranged in between and in contact with the two balls. One end of the screw extends into the top of the chamber such that turning of the screw drives a lower end of the screw further into or out of the chamber and optionally moves the chamber in an upwards or downwards direction. Turning of the screw thus effects a change in the distance between the two balls, which upon approaching one another push the pointed side of the wedge outwards. The wedge which is directly or indirectly connected to the pole pieces transfers this movement onto the pole pieces, and thus changes their radial position in the objective lens arrangement, for instance relative to the first pole piece. Other adjustment mechanisms known in the art may also be used.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
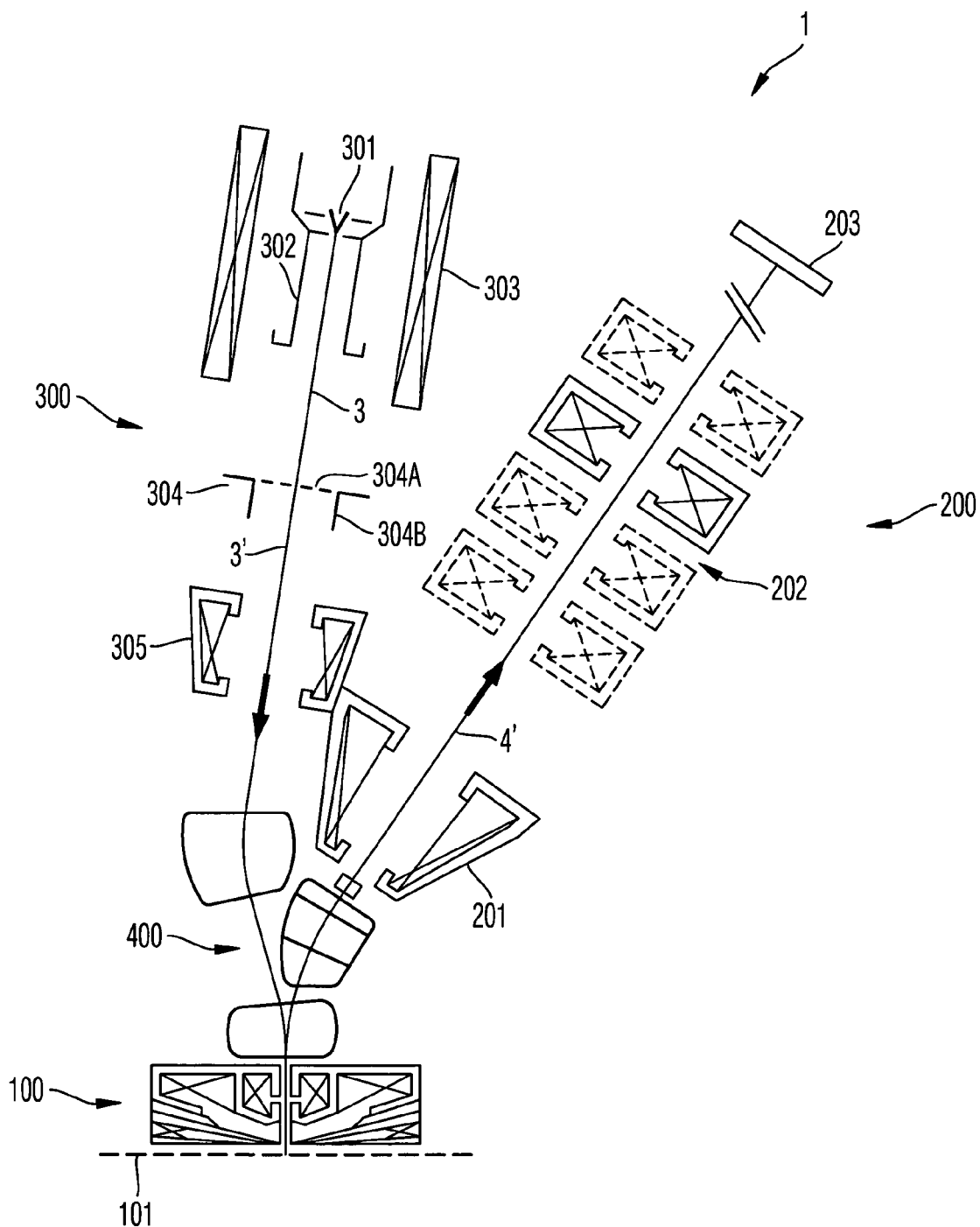
FIG. 1 schematically illustrates basic features and functions of an electron microscopy system according to an embodiment of the present invention.

In the exemplary embodiments described below, components that are alike in function and structure are designated by alike reference numerals, as far as possible. Therefore, in order to understand the features of the individual components of one specific embodiment, the descriptions of other embodiments and of the summary of the invention may also be considered and referred to.

FIG. 1 is a schematic diagram symbolically illustrating basic functions and components of an electron microscopy system 1. The electron microscopy system 1 is of a scanning electron microscope type (SEM) using a plurality of primary electron beamlets 3' for generating primary electron beam spots on a surface of an object to be inspected, which surface is arranged in an object plane 101 of an objective lens arrangement 100.

The primary electrons incident on the object at the beam spots generate secondary electrons emanating from the surface of the object. The secondary electrons form secondary electron beamlets entering the objective lens arrangement 100. The electron microscopy system 1 provides a secondary electron beam path 4' for supplying the plurality of secondary electron beamlets to a detecting arrangement 200. Detecting arrangement 200 comprises a projecting lens arrangement 201, 202 for projecting the secondary electron beamlets 4' onto a surface plane of an electron sensitive detector 203. The detector 203 can be one or more selected from a solid state CCD or CMOS, a scintillator arrangement, a micro channel plate, an array of PIN diodes and others.

The primary electron beamlets 3' are generated by a beamlet generating arrangement 300 comprising an electron source 301, a beam liner tube 302, a collimating lens 303, a multi-aperture plate arrangement 304 and a field lens 305.

In the embodiment depicted in FIG. 1, an electron source 301 is arranged on an optical axis of the system in a beam liner tube 302 and is additionally immersed in a magnetic field generated by collimating lens 303. The electrons are extracted from the electron source 301 and form a diverging electron beam, which is collimated by collimating lens 303 to form a beam 3 for illuminating multi-aperture arrangement 304. Multi-aperture arrangement 304 comprises a multi-aperture plate 304A, which is mounted in a center of a cup-shaped electrode 304B. An electrical field may be generated between the cup-shaped electrode 304B and a flange at the end of beam liner tube 302, which may be a decelerating or retarding field, for instance. The multi-aperture arrangement forms a plurality of primary electron beamlets 3' from the single illuminating beam 3 impinging on the multi-aperture plate 304A. Details of multi-aperture arrangements may be found in the references cited in the introduction or WO 2005/024881 A2 (U.S. provisional application Ser. No. 60/500,256) to the same Assignee, for instance.

A field lens 305 and objective lens arrangement 100 are provided in the beam path 3' of the plurality of primary electron beamlets to project an image of a focus plane of the multi-aperture arrangement 304 onto object plane 101 to form an array of primary electron beam spots on the object.

A beam path splitting/combining arrangement 400 is also provided in the primary electron beam path 3' in between the beamlet generating arrangement 300 and objective lens arrangement 100 and in the secondary electron beam path 4' in between the objective lens arrangement 100 and the detecting arrangement 200.

Beam splitting arrangement 400 allows the beam paths of the primary electron beamlets 3' and the secondary electron beamlets 4' which both pass through the objective lens arrangement 100 to be separated such that the secondary electron beamlets are directed towards the detecting arrangement 200. An exemplary beam splitting arrangement will be described in more detail with reference to FIG. 9.

Figure 2:
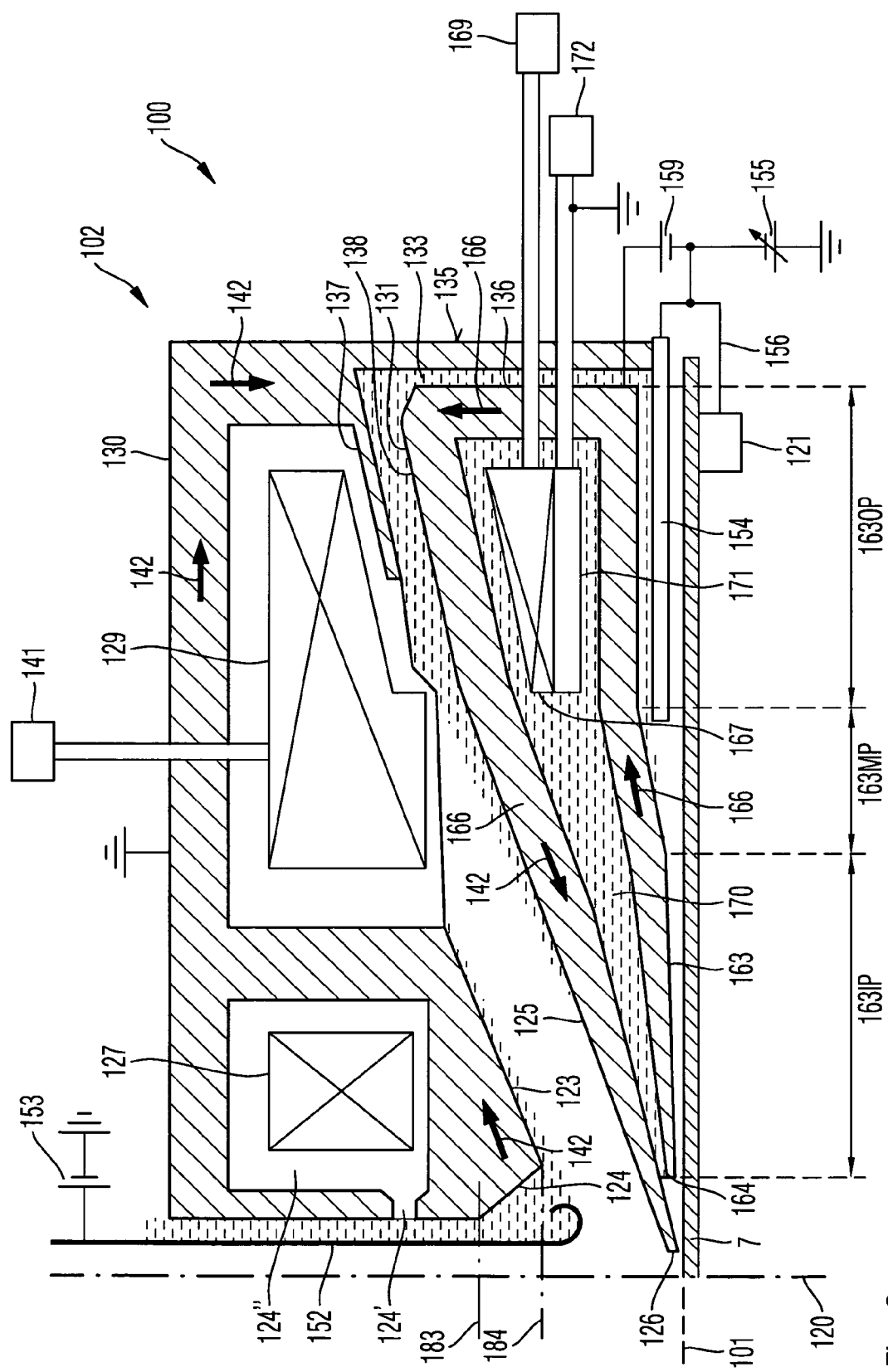
FIG. 2 is a schematic illustration of an embodiment of an objective lens arrangement, which may be used in the electron microscopy system depicted in FIG. 1.

FIG. 2 shows a schematic cross section of a side view of an exemplary embodiment of an objective lens arrangement 100 which may be used in the electron microscopy system shown in FIG. 1. The objective lens arrangement 100 comprises an object mount 121 for mounting an object 7 to be inspected such that a surface of the object 7 is disposed within the object plane 101 of the electron microscopy system 1. The object 7 may be a semiconductor wafer, for instance, which is to be inspected for defects.

The objective lens 102 comprises a first pole piece 123, which is concentric about the optical axis 120 (or axis of symmetry) of the objective lens 102 and has a radial inner end 124. A second magnetic pole piece 125 which is also rotationally symmetric and concentric about the optical axis 120 has a radial inner end 126 and is disposed at a distance from radial inner end 124 of the first pole piece 123 such that a substantially axial gap is formed between the radial inner ends 124 and 126.

An excitation coil 129 is disposed radially outwardly of (i.e. at a greater distance from) the gap formed between inner ends 124, 126 in between the first and second pole pieces 123, 125. A yoke 130 forms part of the first pole piece and extends radially outwardly there from and is disposed opposite a yoke 131 formed by and extending radially outwardly from second pole piece 125. An electrically insulating resin 133 is provided in a gap between yoke 130, or excitation coil 129, respectively, which is disposed to be at least partially surrounded by yoke 130, and yoke 131 in that region where yokes 130, 131 are disposed adjacent to one another. Yoke 130 comprises a cylindrical portion 135, which is separated by insulating resin 133 from a corresponding adjacent cylindrical portion 136 of yoke 131, with the cylindrical portion 135 of the yoke 130 of the first pole piece 123 partially surrounding the cylindrical portion 136 of the yoke 131 of the second pole piece 125. The first yoke 130 further comprises an annular disc-shaped portion 137, which is separated by the insulating resin 133 from an adjacent corresponding annular disc-shaped portion 138 of yoke 131. Thus, the first and second yokes 130, 131 are configured and arranged such that a region between yokes 130 and 131, or more precisely cylindrical and annular disc-shaped portions thereof, provides a considerable surface area such that a magnetic resistance between yokes 130 and 131 extending from and forming part of pole pieces 123 and 125, respectively, is low whilst both pole pieces 123, 125 are kept electrically insulated from each other.

A power supply 141 is connected to first excitation coil 129 for supplying an excitation current to the first excitation coil 129 for generation of a magnetic field in the gap between radial inner ends 124, 126 of first and second pole pieces 123, 125. The electric field generated by the first excitation coil 129 induces a magnetic flux, indicated by arrows 142, in a magnetic circuit formed by magnetic pole pieces 123, 125 and yokes 130 and 131 such that the magnetic circuit is closed via the first gap formed between radial inner ends 124 and 126 of the first and second pole pieces 123 and 125, respectively. The magnetic field generated by the first excitation coil 129 has a focusing effect on the electrons of primary electron beamlets exiting from a beam tube 152 arranged coaxially with the optical axis 120.

A lower end of the beam tube 152 is disposed in a region of the first gap between radial inner ends 124, 126 of the first and second pole pieces 123, 125. A high voltage supply 153 is provided to maintain the beam tube 152 at a potential of about +30 kV, in this embodiment. A voltage supply 155 is connected to the object mount 121 via a connector 156 to supply an adjustable high voltage of about −29.7 to −28 kV to the object mount 121. The object 7 to be inspected is arranged to be in electrical contact with object mount 121 such that object 7, too, is maintained at the adjustable potential of about −29.7 to 28.0 kV.

A cathode of an electrode arrangement (upstream, not depicted) is maintained at a voltage of from about −30 kV to about −45 kV such that the primary electrons have a kinetic energy of from about 60 to 90 keV when they travel through the beam tube 152. A lower end of beam tube 152 is disposed at a distance from the object plane 101 such that the primary electrons experience a decelerating electric field in a space between the lower end of the beam tube 152 and the object plane 101. The primary electrons will then be incident on the object 7 with a landing energy of from about 50 eV to about 3000 eV.

In addition, a radial inner portion of the first pole piece 123, i.e. a portion comprising a radial inner part of yoke 130 and radial inner end 124 of the first pole piece 123, includes a cavity 124" in which an excitation coil 127 is disposed. Excitation coil 127 is connected to a non-depicted further power supply in a manner similar to power supply 141 and electrically insulated from the first pole piece 123 including yoke 130. A further gap 124' is formed within the radial inner end 124 of the first pole piece 123 which gap 124' is joined with cavity 124". Thus, the first pole piece is functionally divided and configured to form a fourth pole piece and a third gap 124'. When excitation coil 127 is excited by the respective power supply, a magnetic field is generated in a region of the gap 124', which magnetic field serves to finely adjust a strength and position of the focusing magnetic field generated by excitation coil 129 in the first gap between the first pole piece 123 and the second pole piece 125.

The electrical field generated between the lower end of beam tube 152 and the object 7 is not only defined by their positions and voltages applied thereto, but is in the depicted embodiment also influenced by a voltage applied to the second pole piece 125. The radial inner end 126 of the second pole piece 125, in particular, may, for instance, be maintained at a voltage of +3.9 kV relative to the electrical connector 156 of object mount 121, by a high voltage source 159 which is coupled to both the electrical connector 156 and the second pole piece 125. An effect thereof is described in more detail with reference to FIG. 5 below. In addition, in the embodiment depicted in FIG. 2, shielding electrode 154 is shown to which the same voltage as to electrical connector 156 or object mount 121, respectively, is applied so as to shield the object from an electrical field in an area of the shielding electrode 154, thus preventing undesired charging of the object. The shielding electrode has an annular shape with an inner aperture, and is symmetric with respect to the optical axis 120 and further disposed such that charged particles may pass through the inner aperture to reach the object.

Figure 3:
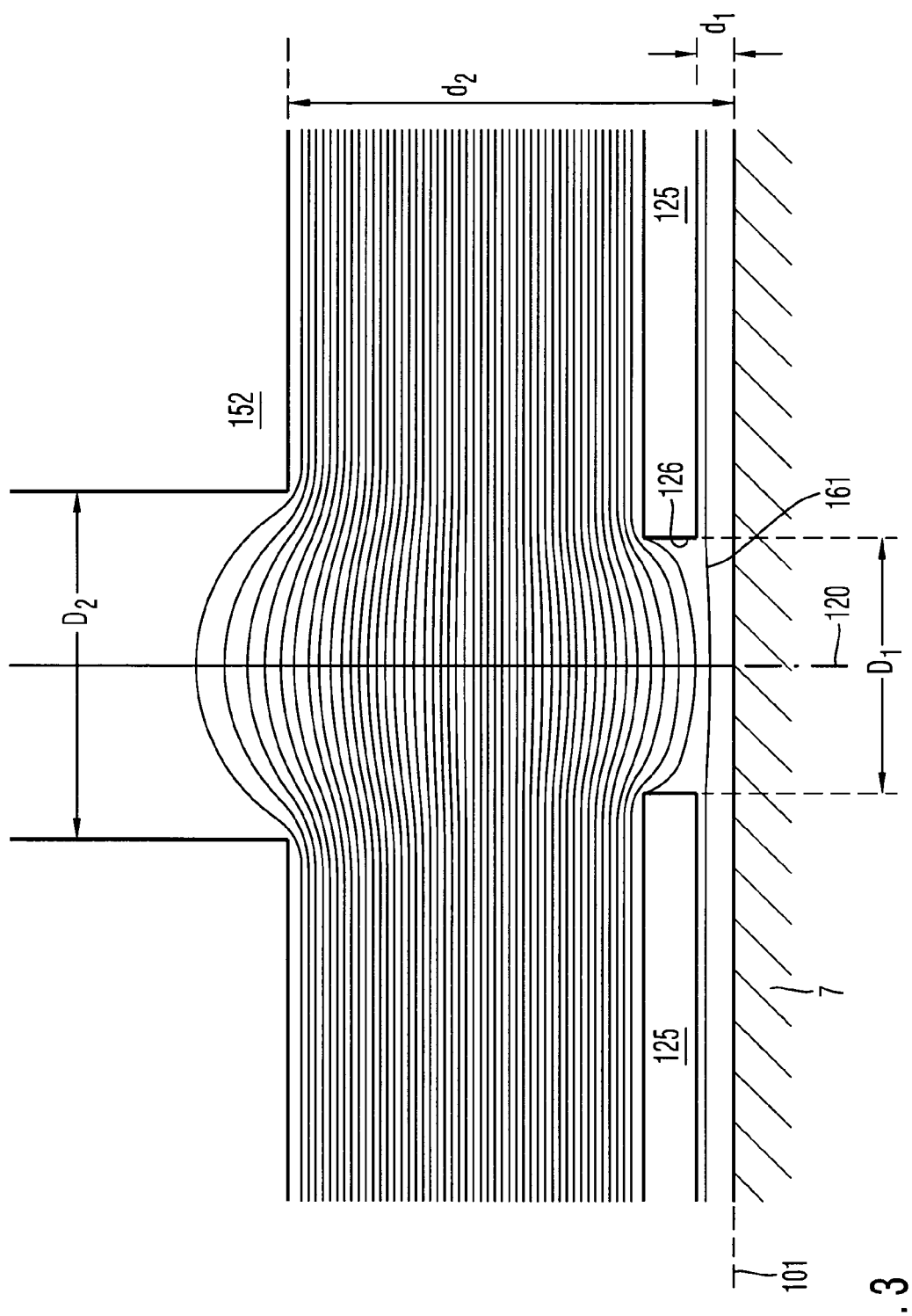
FIG. 3 shows an electrode configuration for illustrating a function of field generating components shown in FIG. 2.

As illustrated in FIG. 3, a lower edge of second pole piece 125 is disposed, at its radial inner end 126, at a distance $d_1$ from the surface of object 7 which surface coincides with object plane 101. The lower end of beam tube 152 is disposed at a distance $d_2$ from the object plane 101. A diameter of the bore defined by radial inner end 126 of pole piece 125 is denoted $D_1$ and a diameter of the beam tube 152 at its lower end is denoted $D_2$.

Distances $d_1$ and $d_2$, diameters $D_1$ and $D_2$ and the voltages applied to pole piece 125 and beam tube 152 relative to the object 7 are adjusted such that the electrical field generated immediately above object plane 101 in a region close to the optical axis 120 is a substantially homogeneous electrical field. FIG. 3 shows several field lines or equipotential lines representing the electrostatic field between the lower end of beam tube 152 and pole piece 125, and between pole piece 125 and the object 7. As illustrated in FIG. 3, a field line 161 closest to the object plane 101 is a substantially straight line indicating a substantially homogeneous electrical field in a region around optical axis 120. Such a substantially homogeneous electrical field is generated for the purpose of decelerating each of the primary electron beamlets 3 to a desired landing energy. The substantially homogenous electrical field may also provide a extraction field for the secondary electrons emanating from the object 7 such that each of the secondary electron beamlets 4' has a substantially same kinetic energy when entering the objective lens 102.

In the configuration of the objective lens arrangement as illustrated in FIG. 2, the electrical field at the object plane 101 may be divided into two components: A first component $E_1$ of the electrical field is generated by the potential difference between pole piece 125 and object 7, and a second component $E_2$ is generated by the potential difference between beam tube 152 and object 7. Both components have a substantially same effect on the electrical field at the object plane 101 in a region around the optical axis 120. This may be illustrated by changing the voltages applied to the beam tube 152 and to the pole piece 125 according to the following two settings: in a first setting, beam tube 152 is set to a potential of 59 kV relative to the object 7, and pole piece 125 is at the same potential as the object 7. The resulting electrical field at the object plane 101 and on the optical axis 120 is 1.8 kV/mm. In a second setting, pole piece 125 is at a potential of 3.9 kV relative to the object 7 and the beam tube 152, and the resulting electrical field at the object plane 101 is 1.2 kV/mm.

The requirement $$\frac{(E_1 - E_2)}{2 \cdot (E_1 + E_2)} = 0.1 < 0.3$$

is thus fulfilled.

In the embodiment illustrated in FIG. 2, a third pole piece 163 extends almost parallel to the object plane and has a radial inner end 164. The radial inner end 164 of the third pole piece 163 is disposed at a greater distance from the optical axis 120 than the radial inner end 126 of the second pole piece 125, and both radial inner ends are disposed in a same plane orthogonal to the optical axis 120. A radial gap is thus formed between radial inner end 164 of third pole piece 163 and radial inner end 126 of second pole piece 125. Pole piece 163 is integrally formed with yoke 131 such that a magnetic circuit is formed by pole piece 125, yoke 131 and pole piece 163, with this magnetic circuit being closed via the gap formed between inner ends 126 and 164 of pole pieces 125 and 163, respectively. A magnetic flux, indicated by arrows 166, in this magnetic circuit is generated by an excitation coil 167 to which current is supplied by a power supply 169. A space formed in the gap between pole pieces 125 and 163 is filled with an insulating resin 170 which serves to form a layer of insulating material between excitation coil 167 and pole pieces 125 and 163 and yoke 131. Thus, the excitation coil 167 is electrically insulated from pole pieces 125 and 163 such that it may be operated at ground potential.

In FIG. 2, it is also indicated that the third pole piece 163 has a radial inner annular portion 163IP where a surface of the third pole piece facing the object 7 extends substantially parallel to the object 7 disposed in the object plane at a first distance from the object 7. In addition, the third pole piece 163 has a radial outer annular portion 163OP where the surface of the third pole piece 163 facing the object 7 extends substantially parallel to the object plane 101 at a second distance from the object 7. The second distance is greater than the first distance, that is the outer annular portion 163OP is disposed further away from the object 7 than the inner annular portion 163IP. Since the inner and outer annular portions 163IP, 163OP may be disposed at a small angle relative to the object 7, the first and second distances may refer to average first and second distances. Inner and outer annular portions 163IP, 163OP are joined by middle portion 163MP, which is disposed at a greater angle relative to the object 7 than both the inner and outer annular portions 163IP, 163OP of the third pole piece 163. It can also be seen from FIG. 2 that a radial outer end of the inner annular portion of the third pole piece is disposed radially within the inner aperture of the shielding electrode.

FIG. 2 further schematically indicates a supply line 171 of cooling water to provide cooling for excitation coil 167. The line 171 is supplied with cooling water by a cooling water supply 172, which is also set to ground potential. Thus, the cooling water supply 172 and the power supply 169 may be conveniently operated at ground potential as a result of electrical insulation being provided between excitation coil 167 and pole pieces 163 and 125.

The power supply 169 is adjusted to supply an excitation current such that the magnetic field generated in the gap between inner ends 126 and 164 of pole pieces 125 and 163 compensates the focusing magnetic field, generated in the gap between inner ends 124 and 126 of pole pieces 123 and 125, in the object plane 101 and on the optical axis 120. By means of said compensating magnetic field the focusing field may be advantageously compensated to zero, which results in the electrons of the primary electron beamlets, which are incident on the object 7, experiencing substantially no magnetic field immediately above the object 7. This absence of magnetic field in said region allows improving telecentricity as well as errors resulting from an image rotation, which would be induced by the focusing magnetic field.

Figure 5:
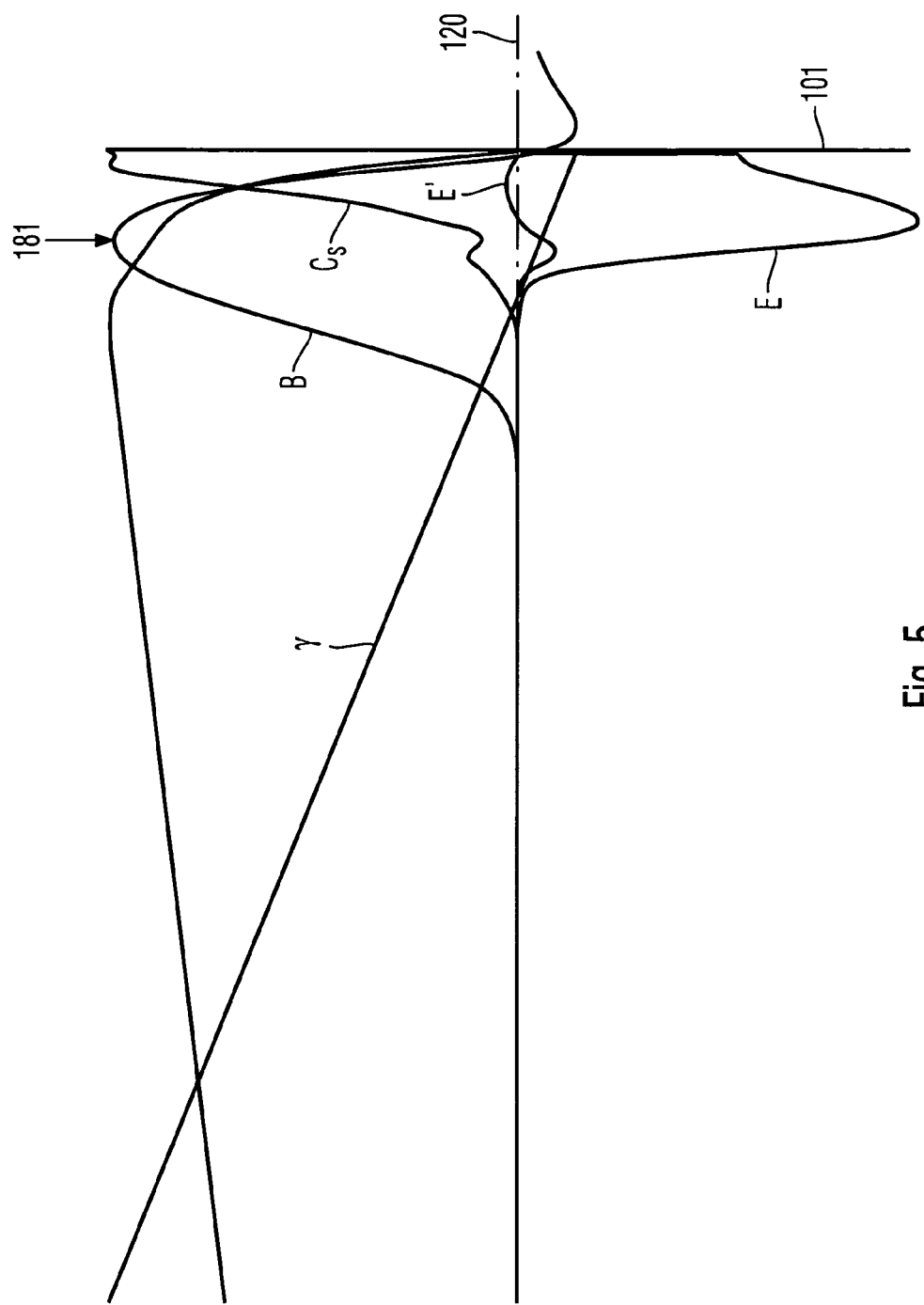
FIG. 5 shows plural physical properties provided by the embodiment of the objective lens arrangement shown in FIG. 2 along the optical axis.

FIG. 5 shows graphs of magnetic flux density or magnetic field strength B and electrical field strength E along the optical axis 120. Starting from the object plane 101, the magnetic field strength B steeply rises to a maximum at a position 181 on the optical axis 120 of the embodiment depicted in FIG. 2. Compared to the steep rise of the magnetic field B starting at the object plane 101 to the position 181 of the maximum, the magnetic field B then shows only a slow decrease with increasing further distance from object plane 101. Such a moderate decrease of B at an increasing distance from the object plane 101 may be achieved by a tapering shape of a bore formed by radial inner end 124 (the inner portion) of pole piece 123. In a first plane 183 disposed at a distance of about 28.4 mm from the object plane 101, the bore has a minimum diameter of about 20 mm. A front surface portion of pole piece 123, which is closest to the object plane 101, is disposed at a distance of about 20 mm in a second plane 184, and a diameter of the bore at this portion is about 41 mm (front diameter). Thus, the diameter of the bore formed by the radial inner end 124 of pole piece 123 radially increases with decreasing distance from the object plane 101 from a minimum value of about 22 mm to a maximum value of about 41 mm (front diameter) in plane 184.

This particular geometry of the radial inner end 124 (or inner portion) of pole piece 123 allows to achieve the relatively moderate decrease of focusing magnetic field strength B with increasing distance from the object plane 101.

FIG. 5 also indicates a γ-ray, which represents a ray starting off at a distance from the optical axis 120 and parallel to the optical axis 120 in the focus plane of the objective lens. This ray γ crosses the optical axis 120 at a position close to position 181, which is the location of the maximum of the focusing magnetic field strength B. This results in a low value of the field curvature, for instance.

FIG. 5 further illustrates that ray γ intersects the object plane 101 at an angle with respect to the optical axis. This indicates that a linear telecentric error may be present in the optical system. However, the small linear telecentric error is not only tolerated but purposely chosen such that a third order telecentric error is reduced, as illustrated with reference to FIGS. 6a and 6b below.

Figure 6A:
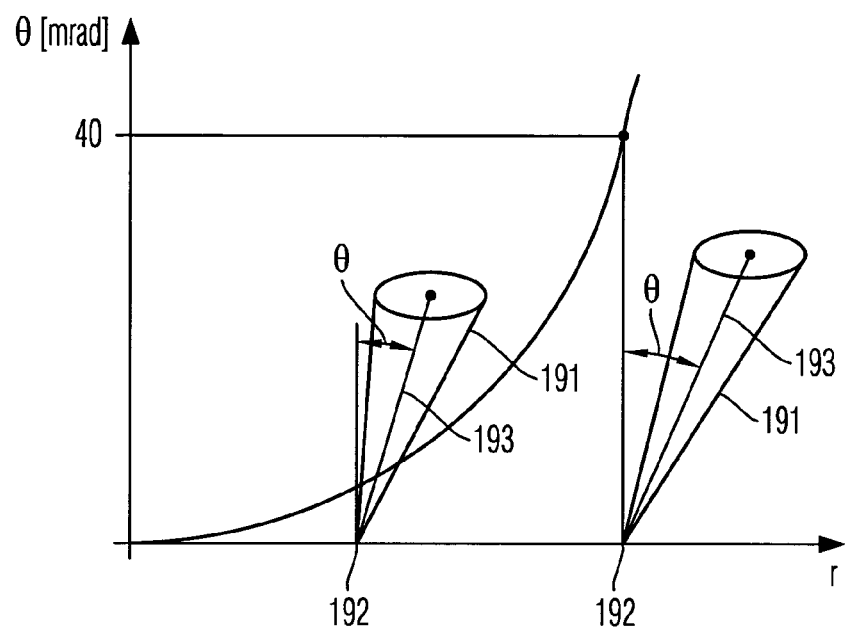
FIG. 6a, FIG. 6b show graphs for illustrating radial dependencies of an average angle of incidence in an object plane of the electron microscopy system shown in FIG. 1.

FIG. 6a illustrates a dependency of the third order telecentric error which objective lens 102 would provide if no first order telecentric error was present. An average angle of incidence θ and thus the third order telecentric error increases with increasing distance r from the central axis or optical axis 120, respectively, according to $r^3$. In FIG. 6a, cones 191 indicate focused beams of primary electrons incident on object plane 101 at locations 192. Directions 193 indicate average directions of incidence of the primary electrons of these focused beams at the respective locations 192. These average directions 193 are oriented under average angles of incidence θ with respect to the optical axis. A maximum average angle θ at a maximum distance of a primary electron beam 191 from the optical axis 120 may be as much as 40 mrad.

Figure 6B:
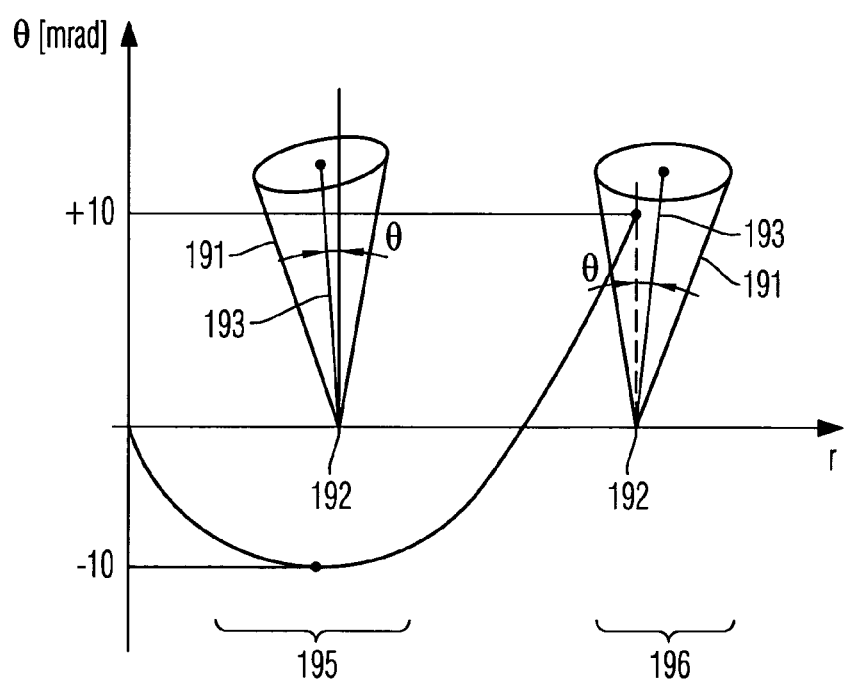

The field lens 305 shown in FIG. 1, for instance, may be designed such that it introduces a linear telecentric error such that the beam path entering objective lens arrangement 100 is not a telecentric beam path. This results in a dependency of the third order telecentric error as shown in FIG. 6b: starting from r=0, the average angle of incidence θ will first pass through a minimum of −10 mrad and then reach a maximum of +10 mrad at the maximum value of r. Thus, compared to the situation shown in FIG. 6a, a maximum value of the third order telecentric error has been successfully reduced.

FIG. 6b may be also interpreted as follows: in an inner ring portion 195 where the negative maximum θ (r) is located, the electron beams incident on the object plane 101 are diverging from the optical axis (negative average angle of incidence, negative maximum $θ_i$), and in an outer ring portion 196 surrounding inner ring portion 195, the primary electron beams incident on the object plane 101 are converging with respect to the optical axis (positive angle of incidence, maximum average angle of incidence $θ_0$). This scenario may be suitably expressed by the ratio $$0.5 < \frac{|θ_i|}{|θ_0|} < 2.$$

Line $C_S$ in FIG. 5 further indicates the dependency of the field curvature, and line E' a dependency of the derivative of the electrical field strength E along the optical axis 120.

It appears that, when starting off at a great distance from the object plane 101, the field curvature $C_S$ gradually increases except for a region, where E' is negative and where the focusing magnetic field B increases. This reduction of the field curvature $C_S$ in the region of negative E' and increasing B is advantageous for reducing the value of $C_S$ at the object plane 101.

Figure 4:
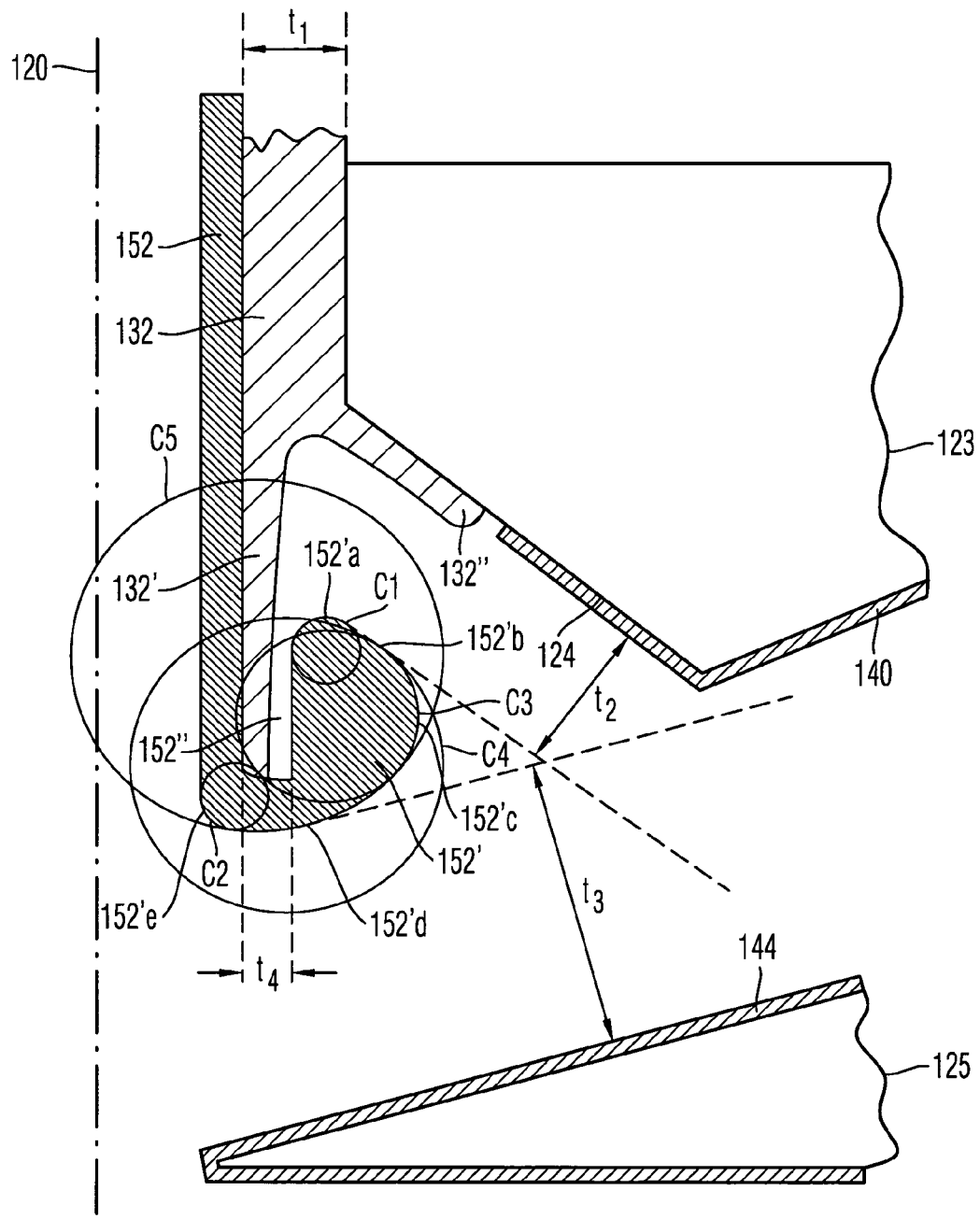
FIG. 4 shows an enlarged view of a lower part of a beam tube of the objective lens arrangement shown in FIG. 2.

In FIG. 4, an exemplary embodiment of a shape of beam tube 152 and insulation 132 between the beam tube 152 and the first pole piece 123 is depicted. Beam tube 152 is, for the largest part, a straight pipe having a substantially constant wall thickness down to a lower end. Lower end of beam tube 152 is constituted by a part of beam tube 152, which is turned by about 180° in a direction of a radial outer side of beam tube 152. The lower end is formed into a rounded rim, leaving a gap 152" between a radially outer side of the straight section of beam tube 152 and rounded rim 152'. Gap 152" has a substantially rectangular shape and extends parallel to the wall of the straight part of beam tube 152. A width $t_4$, i.e. a dimension in radial direction, of gap 152" is about 2 mm. A cross-section of rim 152' may be suitably described by means of radii of circles fitted to an outer surface of rim 152', i.e. a surface facing away from the straight part of beam tube 152. On an uppermost part 152'a of rim 152', i.e. a part farthest away from the object plane 101, the surface profile of rim 152' may be described by a radius of circle C1, which radius is about 1.2 mm, an adjacent part 152'b described by a radius of circle C4, which is about 11 mm, further adjacent part 152'c by a radius of circle C3, which radius is about 3 mm, a radially outer lower end 152'd of rim 152' by a radius of circle C5, which radius is about 6 mm, and a radially inner lower end 152'e of rim 152' by a radius of circle C2, which radius is about 1.2 mm. The uppermost part 152'a of rim 152' is spaced a distance $t_2$ of about 5 mm apart from a radial inner end 124 of the first pole piece 123. The radially lower end 152'd of rim 152' is spaced a distance $t_3$ of about 10 mm apart from electrode 144 disposed on the second pole piece 125.

This shape of the beam tube 152, in particular the design of rim 152' enables the realization of an advantageous shape of electrical field. In particular, a slanted and/or tapered area of inner end 124 of first pole piece 123 is efficiently separated from the optical axis 120.

An insulating member 132 is disposed in a spacing formed in between a part of radial inner end 124 that extends in parallel to an outer side of beam tube 152 and the outer side of beam tube 152 and has a thickness or width $t_1$ of about 4 mm in that area. In an area where a diameter of radial inner end 124 of the first pole piece 123 starts to increase (beginning of slanted or tapered portion of the first pole piece 123, see also plane 183 in FIG. 2), insulating member 132 is split into two portions 132' and 132", with portion 132' extending further along a radial outer side of beam tube 152 until a lower end of gap 152" and portion 132" extending a short way along the slanted portion of the first pole piece 123. This shape and arrangement of insulating member 132 allows efficient electrical insulation of the first pole piece 123 as well as rim 152' from the pipe-shaped portion of beam tube. The region inside gap 152" is void of any electrical fields thus being advantageous for avoiding occurrences of creeping currents and surface leakages. A portion of the slanted (or tapered) portion of the first pole piece 123 is covered by electrode material 140.

Figure 7:
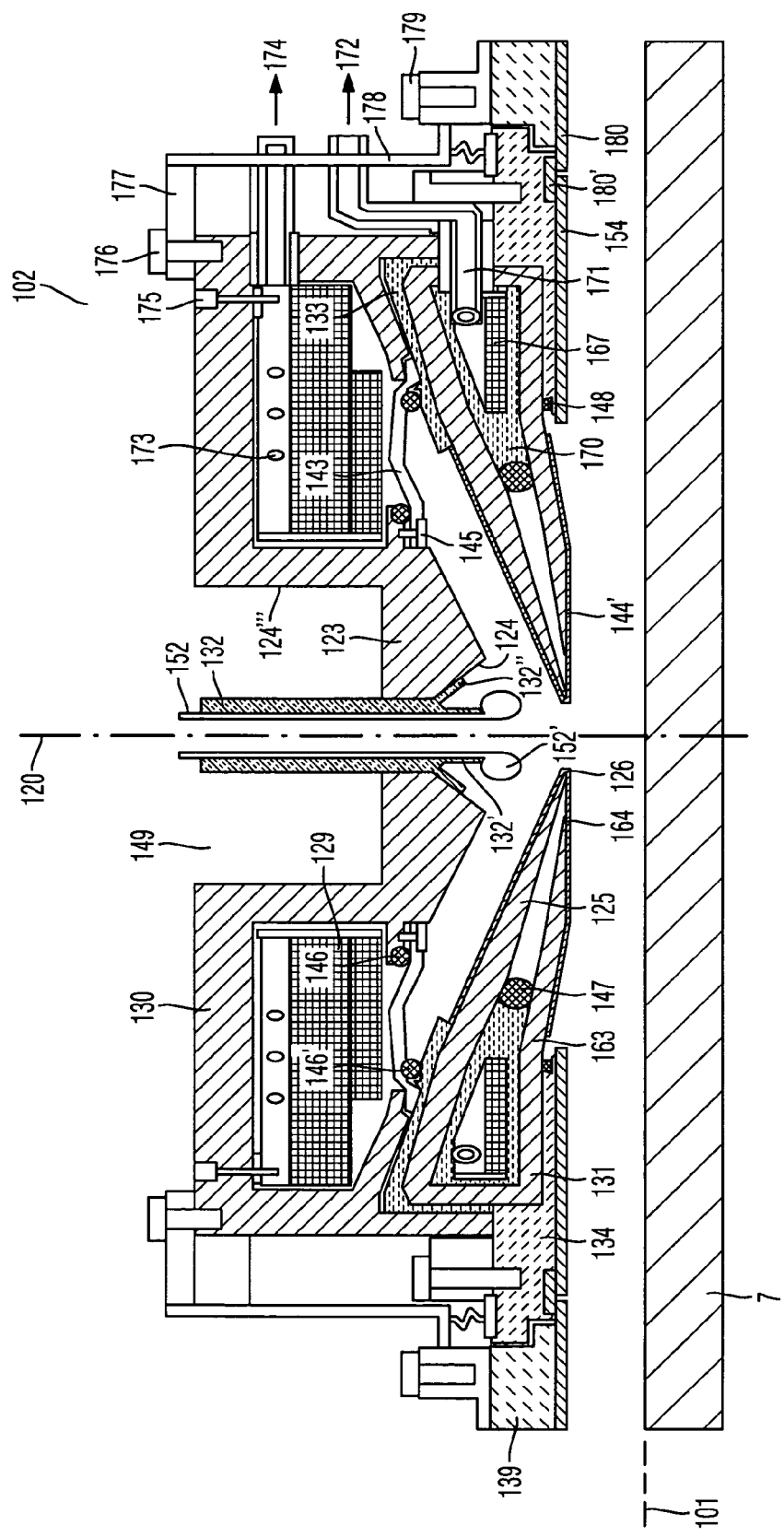
FIG. 7 schematically shows a further embodiment of an objective lens arrangement according to the present invention.

FIG. 7 illustrates a further embodiment of the objective lens arrangement according to the present invention. The numbering of components of the objective lens arrangement of FIG. 2 is adhered to. A shape of the first pole piece 123 is different from the embodiment depicted in FIG. 2 in that is does not provide a cavity and thus no fourth pole piece, and thus no additional adjusting magnetic field is provided.

Instead, alignment elements (not depicted) are disposed in a space 149 between upper radial inner end 124''' of the first pole piece 123 and insulation 132 of beam tube 152. Insulation 132 of beam tube 152 comprises several subsections 132', 132" that have been described in detail with reference to FIG. 4. Other than the lack of cavity 124", an arrangement of the first, second and third pole pieces as well as an arrangement of excitation coils and power supplies is quite similar to the one of the embodiment depicted in FIG. 2. A surface of the second magnetic pole piece 125 facing away from the object plane 101 is, in a radially inner area, covered by electrode material 144, which is connected to electrode material 144' disposed on a radially inner portion of a surface of the third pole piece 163 facing towards the object plane 101. An insulation between first pole piece 123 and second pole piece 125 is provided by insulating resin 133, which insulating resin 133 extends radially inwards up to a radially outer edge of electrode material 144. A space in which excitation coil 129 is disposed inside the first pole piece 123 is separated from an inside of the objective lens arrangement via insulating member 143, one end of which is attached to the first pole piece 123 by a screw 145, wherein a gasket 146 is provided in a gap adjacent to the screw in between the one end of the insulating member 143 and first pole piece 123. An additional gasket 146' is provided at the other end of insulating member 143, which end of the insulating member 143 is interposed between insulating resin 133 and the annular disc-shaped portion of the first pole piece 123. Water-cooling system 173 is disposed immediately adjacent to a side of excitation coil 129, which faces away from the object plane 101, which water cooling system 173 is attached via an electrically insulated screw 175 to yoke 130 of the first pole piece 123. Water-cooling system 173 is connected to a cooling water supply 174 disposed outside of objective lens arrangement 102. The water-cooling system is thus provided conveniently in an environment of about atmospheric pressure.

Excitation coil 167 as well as a line of cooling water are embedded in cast resin 170 in a spacing formed inside second and third pole pieces 125, 163 and yoke 131 to provide electrical insulation from the second and third pole pieces 125, 163 as well as allowing cooling water supply 172 to be provided in an environment of about atmospheric pressure. A gasket 147 is provided adjacent to a radial inner end of cast resin 170, which is also pressed against a surface of the second pole piece 125 facing towards the object plane 101 and a surface of the third pole piece 163 facing away from the object plane 101, thus providing a pressure seal.

Apart from allowing to have water-cooling arrangements 173, 174, 171, 172 in an environment of about atmospheric pressure, the above-described insulating arrangements are advantageous in that they dispose of the need to evacuate large spacings inside the objective lens arrangement.

A ceramic/cast resin member 134 is provided between shielding electrode 154 and a surface of the third pole piece 163 facing towards the object plane 101 in order to provide both electrical insulation between the third pole piece 163 and the shielding electrode 154 as well as to provide a pressure seal. A radially inner end of cast resin/ceramic member 134 has a portion of decreased thickness to accommodate a gasket 148 in between the thin portion of resin/ceramic member 134 and the object-facing surface of the third pole piece 163. Cast resin/ceramic member 134 and shielding electrode 154 are attached to connecting ring 180', which connects the shielding electrode to a further ring 180, disposed in alignment with shielding electrode 154. The further ring 180 has a ring 139 of ceramic/resin material disposed thereon, which, in turn, is connected to cast resin/ceramic member 134 and yoke 130 via screw 179, connecting member 178, and connecting member 177, which is attached to yoke 130 via screw 176.

Figure 8:
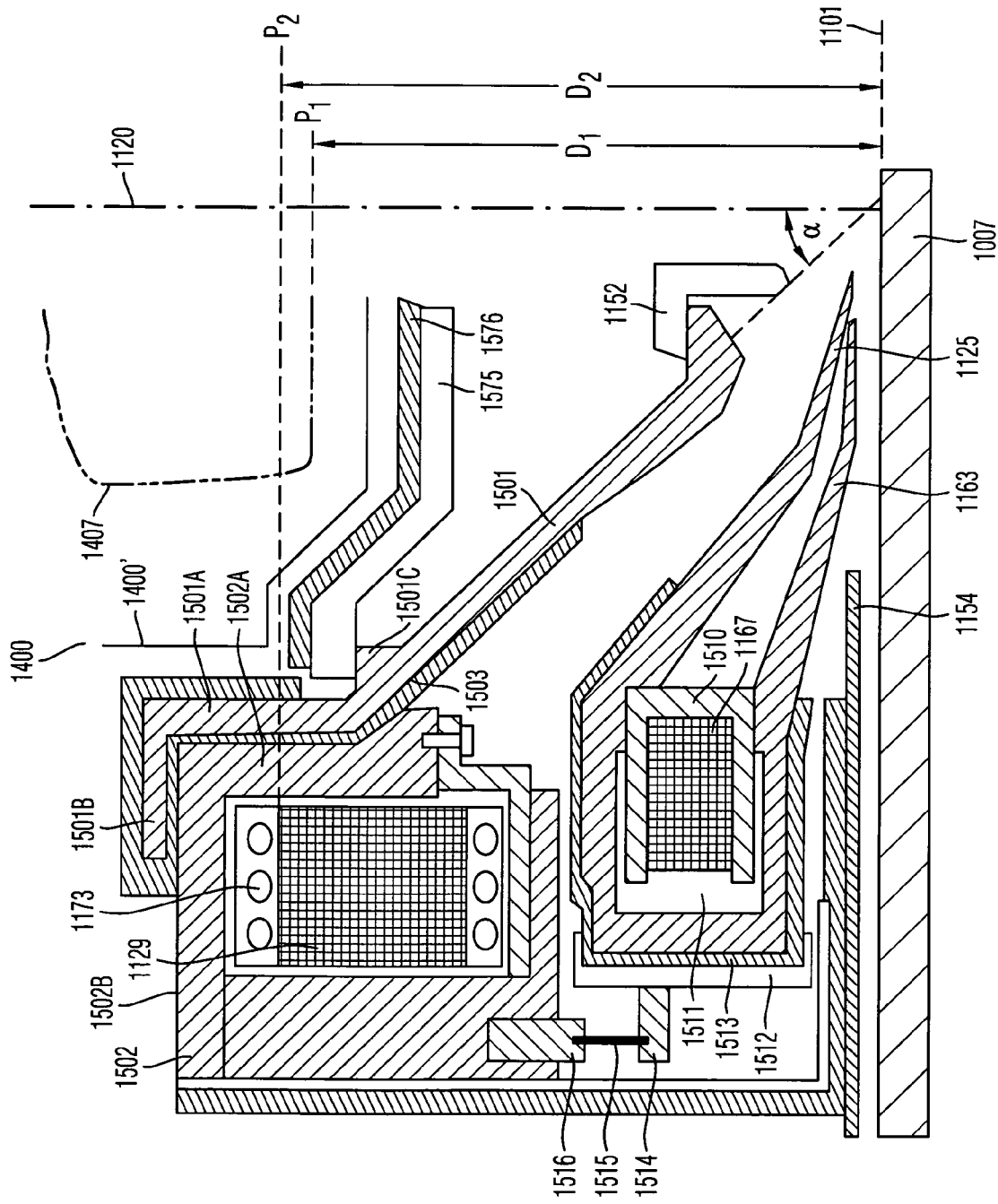
FIG. 8 shows a further, alternative embodiment of an objective lens arrangement according to the present invention.

In FIG. 8, a further embodiment of the objective lens arrangement according to the present invention is illustrated. The principal layout of the main components, such as pole pieces and beam tube, corresponds largely to that of the previously described embodiments. A main difference between the embodiments of FIGS. 2 and 7 on the one hand and FIG. 8 on the other hand is given by the arrangement of the first pole piece relative to the beam tube. Whilst in the previous two embodiments, the first pole piece 123 was electrically insulated from the beam tube 152 and at ground potential, in the embodiment depicted in FIG. 8, an inner portion of the first pole piece 1501 is electrically connected to beam tube 1152. In particular, the beam tube 1152 is attached to a radial innermost portion of the first pole piece 1501. This configuration has an advantage in that provision of voltage to the beam tube 1152 is facilitated as compared to the previously described embodiments. The first pole piece is hence, in this embodiment, set to the same potential as the beam tube. This has no detrimental effect on an electrostatic field or magnetic field in the region of the beam tube 1152. The first pole piece being set to a voltage necessitates the division of the first pole piece into an inner portion 1501 which is connected to the beam tube 1152 and electrically insulated from a second portion 1502 of the first pole piece by an insulating layer 1503. In order to allow magnetic flux to pass from the inner portion 1501 of the first pole piece to the outer portion 1502 of the first pole piece, the inner portion 1501 comprises a cylindrical portion 1501A which is arranged to face and be arranged in parallel to a cylindrical portion 1502A of the outer portion 1502 of the first pole piece. Additionally, the inner portion 1501 of the first pole piece comprises a flat, annular section 1501B joined in a radially outwards direction to the cylindrical portion 1501A and being arranged parallel and opposite to an annular section 1502B of the outer portion of the second pole piece, such as to enable a closed magnetic circuit. Insulating layer 1503 extends along a section of tapering inner portion of the first pole piece 1501, and fills a gap formed between cylindrical portions 1501A, 1502B as well as annular portions 1501B, 1502B.

In FIG. 8, it is also indicated that the inner portion 1501 of the first pole piece also comprises a conus-shaped section having a conus opening angle α with respect to the optical axis 1120.

In addition, water-cooling lines 1173 disposed around excitation coil 1129 are also illustrated in FIG. 8.

A further difference to the previously described embodiments lies in the mounting of the second and third pole pieces, the cooling of the excitation coil arranged in between the second and third pole pieces, and the sealing of spaces inside the various components.

Excitation coil 1167 is encased on three sides in ceramic insulting material 1510, with both the excitation coil 1167 as well as the ceramic insulating material 1510 being fixed in the space between the second and third pole pieces by cast resin 1511. The ceramic insulating material 1510 is connected to an outer ring of thermally conductive material, which in turn, is connected to the first pole piece via copper wiring. This arrangement is not depicted in FIG. 8, for simplicity's sake, but described in detail with reference to FIG. 10. FIG. 8 shows a part of the mounting structure for holding the second and third pole pieces 1163, 1125. The mounting structure comprises a holding bracket 1512 disposed on a radially outer side of the second and third pole pieces 1163, 1125, which bracket 1512 spans an upper side of the second pole piece 1125 and a lower side of the third pole piece 1163. In between the bracket 1512 and the pole pieces 1163, 1125, a further insulating layer 1513 is provided, which extends further along the pole pieces 1163, 1125. The bracket 1512 is fixed to a mounting ring 1514. Mounting ring 1514 is held in position by three metal wires 1515 which are fixed to a lower portion of the first pole piece via connecting member 1516. This mounting structure allows adjusting a position of the pole pieces 1125, 1163 with respect to the first pole piece and the object plane. In addition, this mounting structure enables the second and third pole pieces 1125, 1163 to be disposed entirely in a vacuum environment thus eliminating the need to evacuate a space inside the two pole pieces 1125, 1163 and eliminating a plurality of seals thus increasing an ease of operation and installation.

In a further aspect, the shape chosen for the inner portion 1501 of the first pole piece allows to integrate a component disposed upstream of the objective lens arrangement within a space or bore formed by the inner portion 1501, thus decreasing an overall space requirement of an inspection system and improving optical properties of the system. In the embodiment depicted in FIG. 8, a lower part of a beam path splitting arrangement 1400 is depicted, with an outside thereof being shown in a schematic and simplified manner as outline 1400'. In addition, a lower portion of a magnetic field arrangement 1407 is shown. A step-shaped protrusion 1501C is formed on an inside of the inner portion of the first pole piece 1501, which inside faces away from the object plane. A holding element 1575 having an upper side with an insulating layer 1576 attached thereto is held by and fixed to protrusion 1501C of the inner portion 1501 of the first pole piece. The outside 1400' of the beam path splitting arrangement may be advantageously formed such that its outline corresponds to that formed by the holding elements 1575 and the insulating layer 1576 thereon. The lower portion of the beam path splitting arrangement 1400 may then be arranged such that it remains spaced apart from the holding element 1575 or alternatively such that it rests on holding element 1575 (or insulating layer 1576, respectively). Thus, the lower portion of beam path splitting arrangement 1400 is inserted into a space formed by the cylindrical portion 1501A and annular portion 1501B of the first pole piece. Thus, a lower end of the beam path splitting arrangement, and in particular a lower end P1 of the magnetic field arrangement 1407, is disposed at a first distance $D_1$ from the object plane 1101 which first distance $D_1$ is smaller than a second distance $D_2$ between an upper side P2 of the excitation coil 1129 and the object plane 1101. A conical shaped inner lower portion and a cylindrical upper portion of the inner portion of the first pole piece thus accommodate a portion of the beam splitting arrangement.

Figure 9:
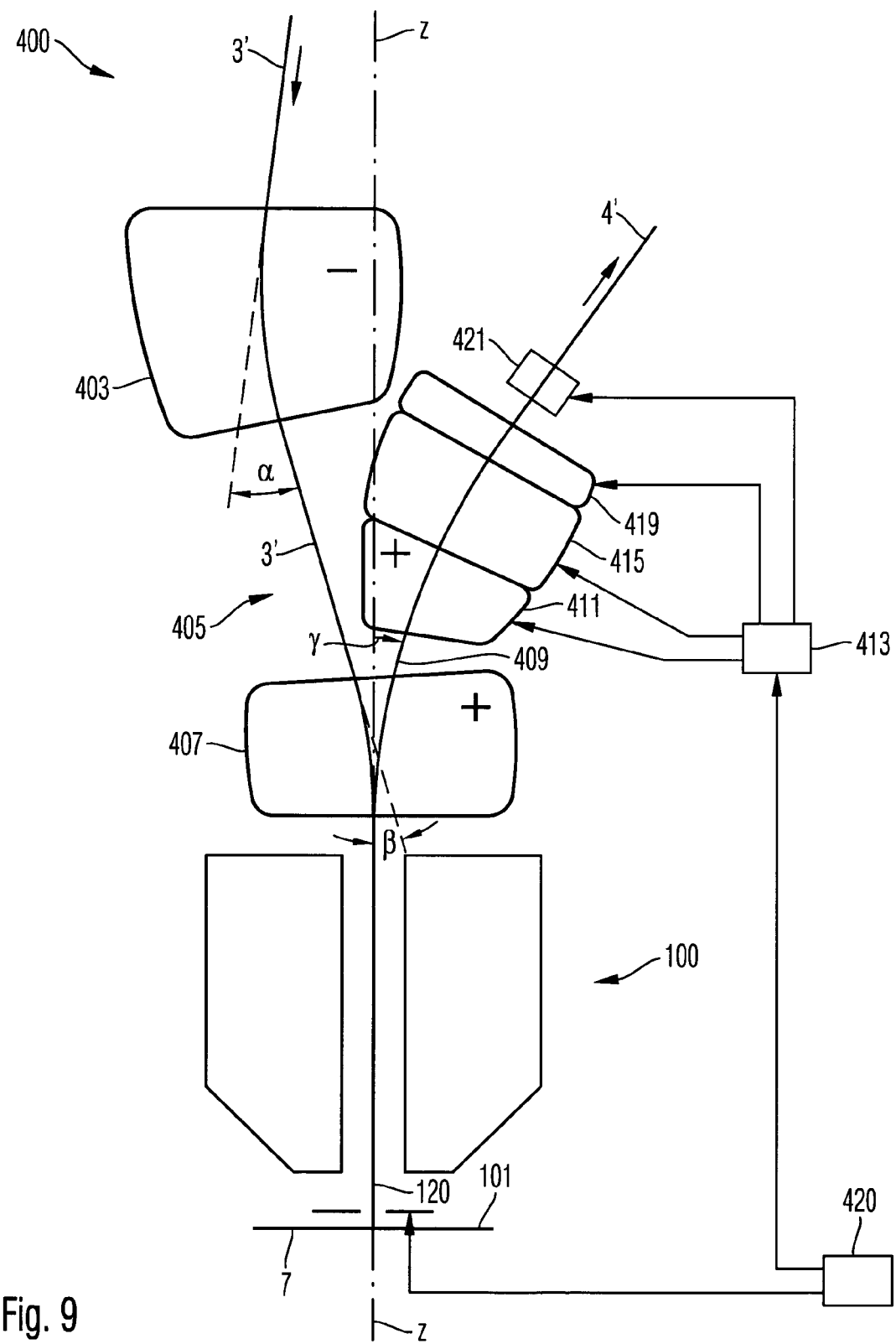
FIG. 9 shows an exemplary embodiment of a beam path splitting arrangement.

In FIG. 9, a schematic illustration of an exemplary beam path splitting arrangement 400 and a simplified embodiment of objective lens arrangement 100 is given. Primary electron beam path 3' comprising a plurality of primary electron beamlets enters a first magnetic field portion 403 of beam path splitting arrangement 400. Field portion 403 provides a homogeneous magnetic field deflecting the primary electron beam path by an angle α to one side, in particular to the left in a direction of travel of the electrons, as viewed in FIG. 9. The primary electron beam path 3' subsequently passes a drift region 405 which is substantially free of magnetic fields such that the primary electron beam path 3' follows a straight line in drift region 405. Then the primary electron beam path 3' enters a field region 407 in which a homogeneous magnetic field is provided for deflecting the primary electron beam path 13 at an angle β to the right. Subsequently, primary electron beam path 3' enters the objective lens arrangement 100 which serves to focus the primary electron beamlets onto the surface of object 7 positioned in object plane 101. The axis 120 of the objective lens arrangement 100 coincides with optical axis z of the entire system.

The objective lens arrangement 100 comprises a magnetic lens group having a magnetic focusing function and an electrostatic lens group having an electrostatic focusing function on the primary electron beamlets. Possible configurations of this electrostatic lens group according to the present invention have been described before, with reference to FIGS. 2 and 8, for instance. Further, the electrostatic lens may be configured to exert a decelerating effect on the primary electrons by an electrical field for decelerating the primary electrons before impinging on object surface 7. The electrostatic lens arrangement referred to in the context of the description of this Figure may be chosen from any suitable embodiments as described above.

A controller 420 is provided for changing the voltage supplied to the electrostatic lens arrangement such that the kinetic energy with which the primary electrons impinge onto the object, the landing energy, may be adjusted, for instance in a range of about 0.3 keV to 2.0 keV. The kinetic energy with which the primary electrons pass the beam path splitting arrangement 400 is generally constant and independent of the landing energy of the primary electrons on the object surface.

Further details of the depicted beam path splitting arrangement may be found in WO 2005/024881 A2 (U.S. provisional application Ser. No. 60/500,256) to the same Assignee. A person skilled in the art will be familiar with the technology for designing and constructing the beam splitter comprising plural magnetic field regions as illustrated above. Reference may be made to U.S. Pat. No. 6,040,576 or "SMART: A Planned Ultrahigh-Resolution Spectromicroscope For BESSY II" by R. Fink et al, Journal of Electron Spectroscopy and Related Phenomena 84, 1987, pages 231 to 250 or "A Beam Separator With Small Aberrations" by H. Müller et al, Journal of Electron Microscopy 48(3), 1999, pages 191 to 204.

The absolute values of the field strengths in field portions 403 and 407 are about equal, and lengths of field portions 403 and 407 are chosen such that a spatial dispersion induced by the deflection by the angle α to the left and the subsequent deflection by the angle β to the right is substantially zero. Further, the field portions 403 and 407 and the drift region 405 are chosen such that the deflections induced by the beam path splitting arrangement 400 on the primary electron beam path 3' are in first order substantially stigmatic and in first order substantially distortion free. Thus, a pattern may be imaged in high quality onto the surface of object 7. This imaging quality is maintained substantially independent of the landing energy of the primary electrons onto the object 7.

The secondary electron beam path 4' comprising a plurality of secondary electron beamlets is separated from the primary electron beam path 3' by field region 407 which deflects the secondary electron beam path 4' by an angle α to the right.

The secondary electrons emanating from the object 7 with a kinetic energy range of about 0 eV to 100 eV, for instance, will be accelerated by the electrical field generated by electrostatic lens arrangement of the objective lens arrangement 100 to a kinetic energy which is dependent on a setting provided by controller 420 for adjusting the landing energy of the primary electrons. Thus, the kinetic energy of the secondary electrons entering field region 407 will change in dependence of the landing energy of the primary electrons.

Deflection angle γ for the secondary electron beam path 4' provided by field region 407 will change, accordingly. After leaving field region 407, the secondary electron beam path passes a drift region 409 which is substantially free of magnetic fields before entering a further magnetic field region 411 providing a homogeneous magnetic field deflecting the secondary electron beam path 4' further to the right. Field strength of field region 411 may be adjusted by a controller 413. After leaving the field region 411, the secondary electron beam path immediately enters a further field region 415 providing a homogeneous magnetic field, a field strength of which may be also adjusted by controller 413. Controller 413 operates in dependence of a setting of the landing energy of primary electron beams and adjusts the magnetic field strength in field regions 411 and 415 such that the primary electron beam path leaves field region 415 at a pre-defined position and in a pre-defined direction which are independent of the landing energy of the primary electrons and the deflection angle γ, respectively. Thus, the two field regions 411, 415 perform a function of two subsequent beam deflectors which allows to adjust the secondary electron beam to coincide with the pre-defined secondary electron beam path 4' when the same leaves magnetic field region 415.

The changes in the magnetic field strengths of field regions 411, 415 caused by controller 413 result in changes of a quadrupole effect, which these electron optical elements 411, 415 have on the secondary electrons. In order to compensate for such changes of the quadrupole effect a further magnetic field region 419 is provided immediately downstream of field region 415. In magnetic field region 419 a homogeneous magnetic field is provided, a field strength of which is controlled by controller 413. Further, downstream of magnetic field region 419 a quadrupole lens 421 is provided which is controlled by controller 413 to compensate, in cooperation with magnetic field region 419, the remaining quadrupole effect induced by field portions 411, 415 when compensating the beam path for different landing energies of the primary electrons.

The electron-optical components 407, 409, 411, 415, 419 and 421 provided in the secondary electron beam path are configured such that, for one particular setting of the landing energy of the primary electrons, the secondary electron beam path through the beam path splitting arrangement 400 is in first order substantially stigmatic, in first order distortion free, and in first order dispersion corrected. For other settings of the landing energy than 2 kV this imaging quality may be maintained, a reduction of the dispersion correction to a limited amount occurs, however.

It is to be noted that an intermediate image of object plane 101 is formed in a region of field portions 407, 411, 415 and 419. A position of the intermediate image will change along the beam axis in dependence of the setting of the landing energy of the primary electrons and the kinetic energy of the secondary electrons, accordingly.

Figure 10:
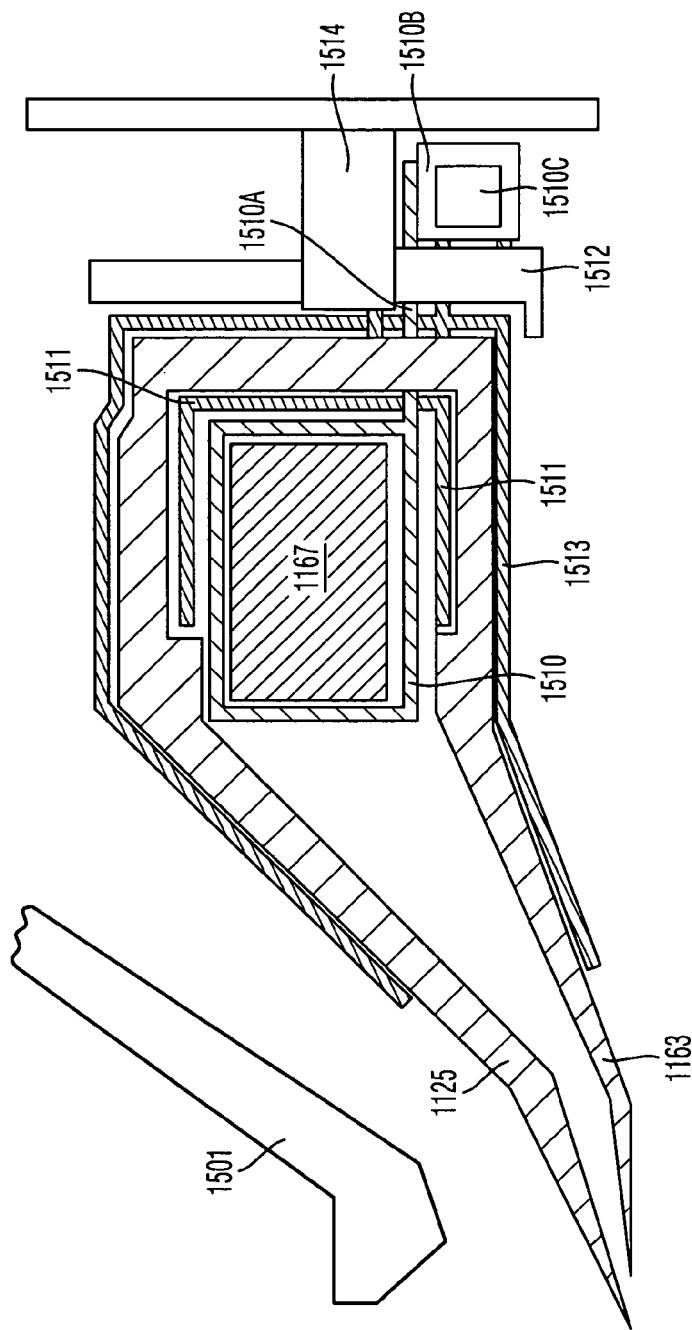
FIG. 10 shows a cooling structure used in the embodiment depicted in FIG. 8.

In FIG. 10, an embodiment of a cooling arrangement based entirely on cooling by means of solid materials suitable for use in particular with the embodiment shown in FIG. 8 is schematically illustrated. Like numerals refer to like components. Excitation coil 1167 is, in this exemplary embodiment, surrounded on practically all sides by a ceramic, electrically insulating layer 1510. Both the excitation coil 1167 and the insulating layer 1510 extend substantially continuously in a full circle around the optical axis (with the exception of electrical connections of the excitation coil penetrating through the ceramic insulation which are connected to an external power supply, not shown). A further layer 1511 of electrically insulating material, in this instance cast resin, is provided on three sides of the arrangement of the excitation coil 1167 and ceramic insulation 1510. The ceramic insulation 1510 is connected via connecting members 1510A to an outer ring comprising both a ring of ceramic material 1512 and a ring comprising an outer ceramic sheath 1510B encasing an inner core 1510C made of copper. Both rings are fixed to mounting ring 1514, which is fixedly attached to the second and third pole pieces 1125, 1163 and has been described with reference to FIG. 8. The ceramic connecting member 1510A provides a thermally conductive contact between the ceramic insulation 1510 around the excitation coil 1167 and the copper core ring 1510C and the ceramic ring 1512 for removing heat generated by the excitation coil 1167. In contrast to the core ring 1510C made of copper and the ceramic insulation 1510 surrounding the excitation coil 1167, the connecting member 1510A is not formed as a continuous ring, but is formed of small ring sections disposed around a circumference of the yoke integrally formed with and connecting the second and third pole pieces 1125, 1163, which small sections penetrate through a radial outer side of the second and third pole pieces 1125, 1163 of said yoke. The copper and ceramic rings, 1510 A through C are connected via a (non-depicted) copper wire to a cooling system outside the evacuated inside of the objective lens arrangement. The connection may be configured, for instance, in analogy to wire 1515 and connecting piece 1516 shown in FIG. 8 in connection with the mounting structure and further extend through the first pole piece to connect to a cooling system of the excitation coil accommodated within the first pole piece. Thus, a cooling system is provided which facilitates electrical insulation of the cooling system from the excitation coil and also allows for a flexible mounting structure for the second and third pole pieces.

Figure 11:
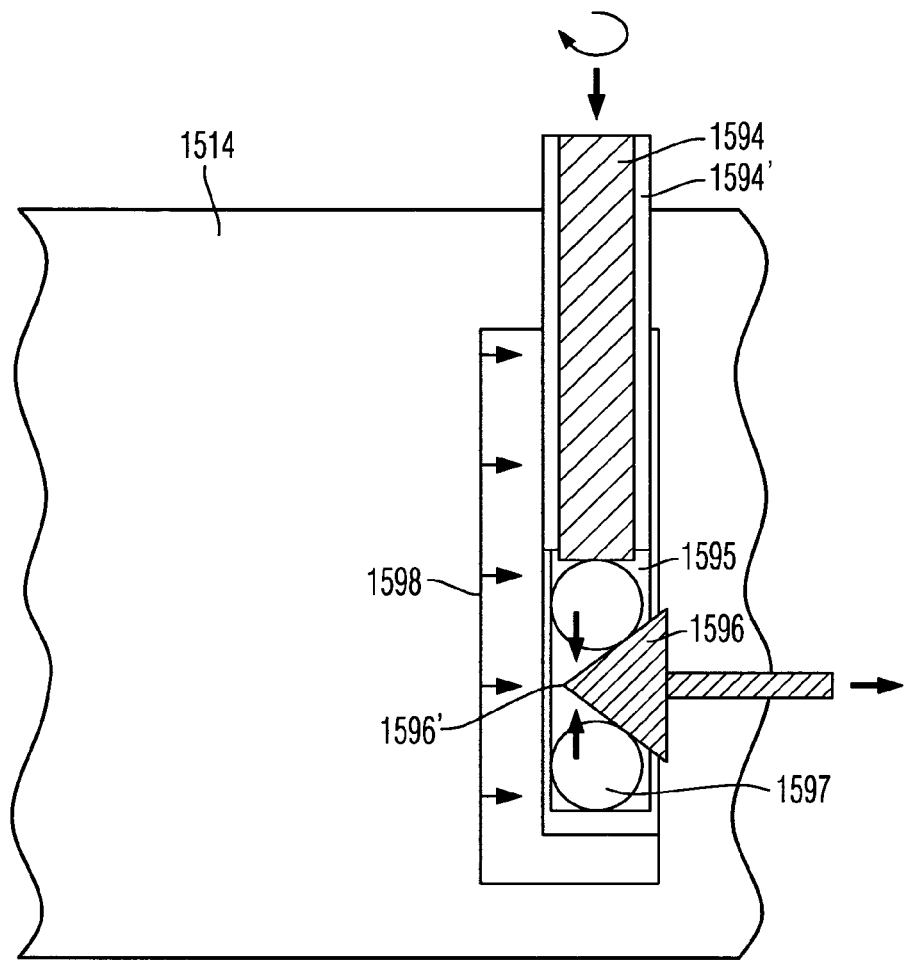
FIG. 11 shows an adjusting mechanism used in the mounting structure for holding the second and third pole pieces in the embodiment illustrated in FIG. 8.

In FIG. 11, an adjusting arrangement for adjusting a radial position of the second and third pole pieces, which are held by mounting ring 1514, as shown in FIG. 8, is illustrated in a schematic and simplified manner. An adjustment screw 1594 is accommodated in a bore 1594' of the mounting ring 1514. The lower end of the bore 1594' and thus the lower end of the screw 1594 are operably linked to a top of a chamber 1595 which contains two balls 1597 on top of one another, i.e. an upper and a lower ball, and a wedge-shaped member 1596, with a pointed edge 1596' of the wedge-shaped member 1596 being disposed in between the two balls 1597. This arrangement may further comprise a counter-bearing, which is only indicated in terms of its effect as arrows 1598 in FIG. 11. The top of chamber 1595 and the screw 1594 are further connected such that turning of the screw 1594 does not only drive the screw 1594 further into the mounting ring 1514 and into the chamber 1595 but also lifts up the mounting ring 1514 together with the bottom of the chamber such that, upon turning of the screw 1594, not only the upper ball is pushed downwards, but also the lower ball pushed upwards. When the two balls are pushed further together, they both exert a force onto the wedge-shaped member 1596 such that the wedge-shaped member 1596 is moved in a radial direction. Since the wedge-shaped member is operably connected to the second and third pole pieces, this radial movement is translated into radial movement of the second and third pole pieces. The same principle applies to turning the screw 1594 in the other direction, with the balls 1597 moving further apart and the wedge-shaped member 1596 moving further into the chamber, again effecting radial movement of the pole pieces.

Figure 12:
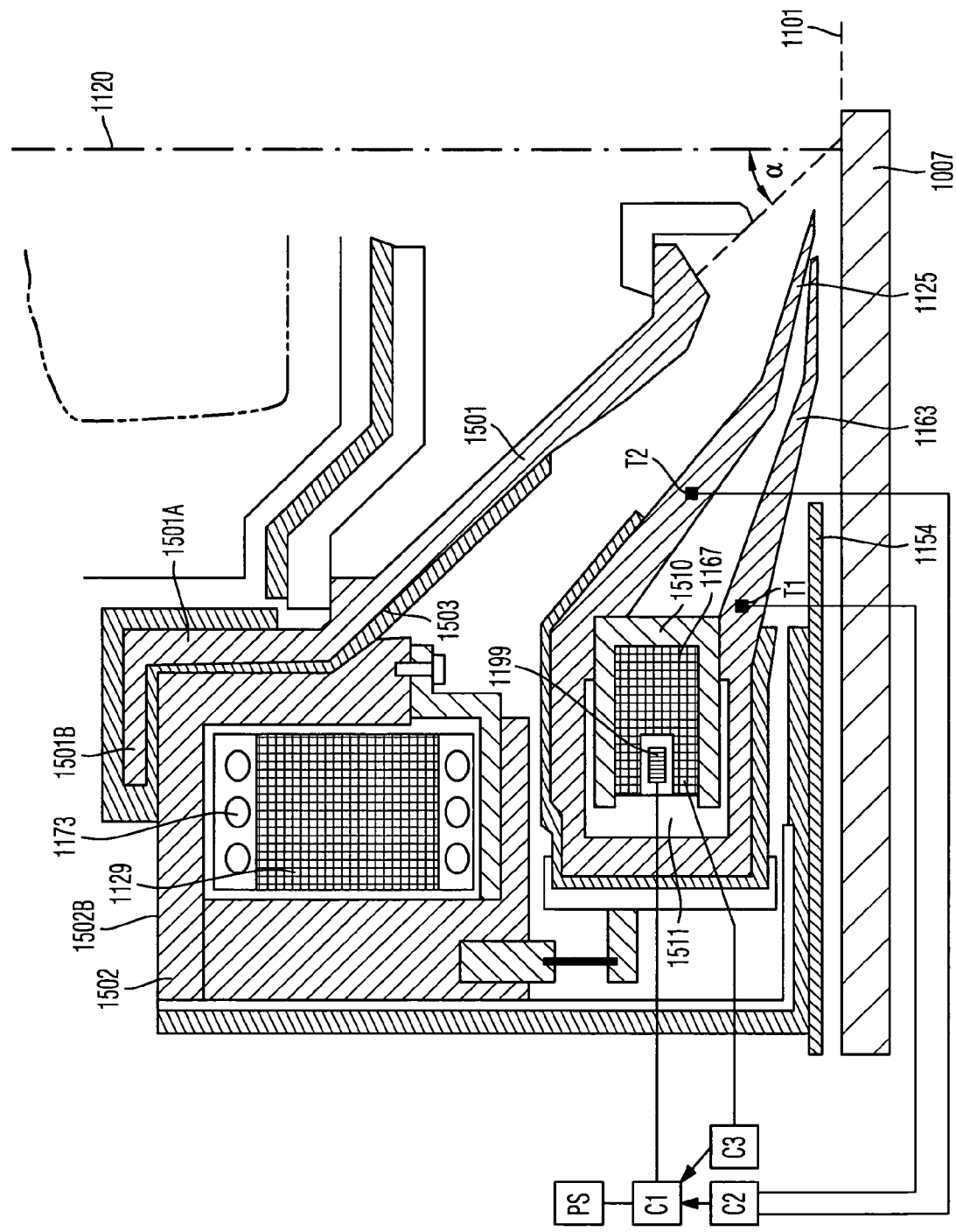
FIG. 12 shows a heating system incorporated into the embodiment shown in FIG. 8.

The embodiment schematically shown in FIG. 12 largely corresponds to that shown in FIG. 8, the difference being that the embodiment shown in FIG. 12 comprises a heating system. The depicted heating system comprises a heating coil 1199 which is provided inside the second excitation coil 1167. The heating coil 1199 comprises several windings of a wire, which is made from the same material as the wire of the second excitation coil 1167 and is disposed adjacent to the wire forming the secondary excitation coil 1167. The heating coil 1199 is connected to a power supply PS and controlled by a control unit C1 which adjusts a current supplied by the power supply PS to the heating coil 1199 in dependence of a temperature of the second and third pole pieces 1163, 1125 and an excitation current supplied to the second excitation coil 1167. The temperature of the second and third pole pieces 1163, 1125 is measured by temperature sensors T1 and T2, which supply the data of the measured temperatures to a control unit C2. The excitation current supplied to the second excitation coil 1167 is controlled by control unit C3. Control units C2 and C3 supply the data of the temperatures of the second and third pole pieces 1163, 1125 and of the excitation current supplied to the second excitation coil 1167 to control unit C1 of the heating system, which calculates an excitation current to be provided to the heating coil 1199 on the basis of the supplied data. Control units C1, C2, C3 may also be portions of a single control unit. Thus, the pole pieces and an environment on the inside of the objective lens arrangement may be kept at a constant temperature and maintain a constant environment.

Figure 13:
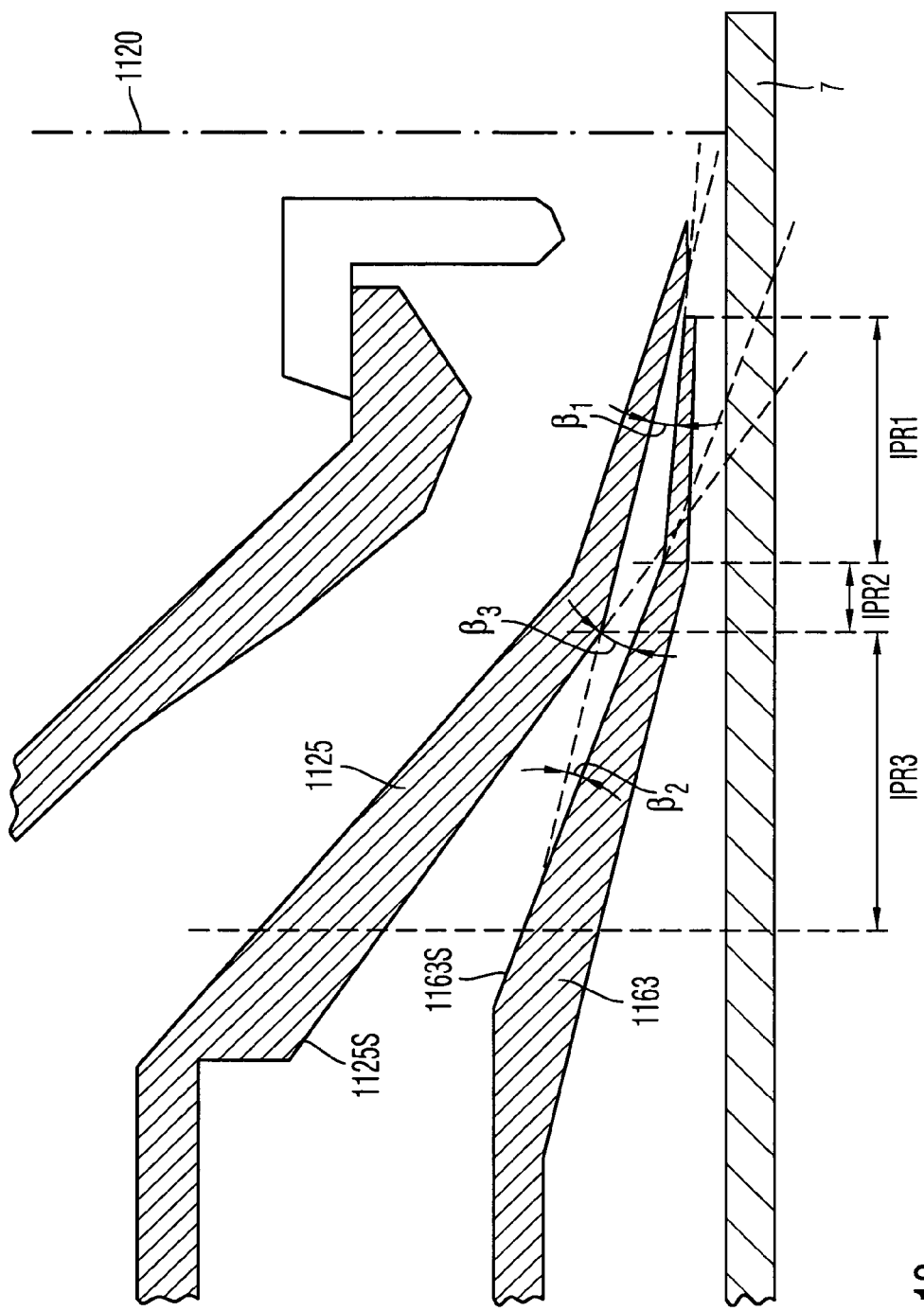
FIG. 13 shows a detail of the embodiment depicted in FIG. 8.

In FIG. 13, a detail of the embodiment shown in FIG. 8 is shown to illustrate angles formed between inside surfaces of the second and third pole pieces 1163, 1125. The second pole piece 1125 has a surface 1125S facing the third pole piece 1163 and the third pole piece 1163 has a surface 1163S facing the second pole piece 1125. In a first annular portion about the optical axis 1120 denoted IPR1 in FIG. 13, the surfaces 1125S, 1163S of the second and third pole pieces 1125, 1163 form an angle $\beta_1$ between them which is about 9°. In a second annular portion about the optical axis 1120 denoted IPR2 in FIG. 13, the surfaces 1125S, 1163S of the second and third pole pieces 1125, 1163 form an angle $\beta_2$ between them which is about 10°. In a third annular portion about the optical axis 1120 denoted IPR3 in FIG. 13, the surfaces 1125S, 1163S of the second and third pole pieces 1125, 1163 form an angle $\beta_3$ between them which is about 15°. Thus, in connection with the small angles of the second and third pole pieces 1125, 1163 with respect to object 7, a relatively wide and flat arrangement of the pole pieces and thus the entire objective lens arrangement is realized.

While the invention has been described also with respect to certain specific embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. An objective lens arrangement, wherein the objective lens arrangement comprises:
    an object mount for mounting an object to be processed in an object plane;
    a first pole piece and a second pole piece, wherein the first and second pole pieces are substantially rotationally symmetric with respect to an axis of symmetry, wherein a radial inner end of the first pole piece is disposed at a distance from a radial inner end of the second pole piece to form a first gap, wherein the second pole piece is closer to the object mount than the first pole piece;
    a first excitation coil for generating a focusing magnetic field in the first gap;
    a beam tube extending through a bore formed by the radial inner end of the first pole piece; and
    a first voltage source for supplying a voltage to the beam tube such that the beam tube is at a potential different from a potential of the second pole piece,
    wherein the bore extends from a first plane where a diameter of the bore is a minimum diameter to a second plane in which a front surface portion of the first pole piece is disposed, wherein the front surface portion is the portion of the first pole piece disposed closest to the object plane, wherein a diameter of the bore at the front surface portion is a front diameter, wherein a difference between the front diameter and the minimum diameter is more than 10 mm, and wherein a distance between the first and second plane is more than 5 mm
    wherein the bore has a tapered portion and the bore diameter increases with decreasing distance from the object plane.

2. An objective lens arrangement according to claim 1, wherein the beam tube is electrically insulated from the first pole piece.

3. The objective lens arrangement according to claim 1, wherein the first pole piece is set substantially at ground potential.

4. The objective lens arrangement according to claim 1, wherein the first voltage source is configured for supplying a voltage to the beam tube such that the beam tube is at least 15 kV above ground potential.

5. The objective lens arrangement according to claim 1, wherein the first voltage source is configured for supplying a voltage to the beam tube such that the beam tube is at least 30 kV above ground potential.

6. The objective lens arrangement according to claim 1, wherein the first voltage source is configured for supplying a voltage to the beam tube such that the beam tube is at least 45 kV above ground potential.

7. The objective lens arrangement according to claim 1, wherein the object mount has an electrical connector for supplying an electrical voltage to the object, and further comprising a second voltage source connected to the electrical connector and the second pole piece.

8. The objective lens arrangement according to claim 7, wherein the second voltage source is configured for supplying a voltage to the electrical connector such that the electrical connector is one of grounded and at least 0.1 kV below ground potential.

9. The objective lens arrangement according to claim 7, wherein the second voltage source is configured for supplying a voltage to the electrical connector such that the electrical connector is at least 15 kV below ground potential.

10. The objective lens arrangement according to claim 7, wherein the second voltage source is configured for supplying a voltage to the electrical connector such that the electrical connector is at least 30 kV below ground potential.

11. The objective lens arrangement according to claim 7, further comprising a third voltage source for supplying a voltage to the second pole piece such that a potential of the second pole piece is from 0.1 kV to 10 kV above a potential of the electrical connector.

12. The objective lens arrangement according to claim 1, further comprising a third pole piece having a radial inner end which is disposed at a distance from the radial inner end of the second pole piece to form a second gap, wherein the first pole piece is electrically insulated from the second and third pole pieces by an insulating layer.

13. The objective lens arrangement according to claim 12, wherein the insulating layer is provided between an outer portion of the first pole piece and an outer portion of the second pole piece.

14. The objective lens arrangement according to claim 13, wherein the first pole piece comprises an inner member and an outer member, the outer member comprising the outer portion of the first pole piece, with the inner and outer members being electrically insulated from each other by an insulating layer.

15. The objective lens arrangement according to claim 14, wherein the outer member of the first pole piece is configured to accommodate the first excitation coil and wherein the inner member of the first pole piece comprises a substantially conical portion extending towards the axis of symmetry.

16. A particle optical inspection system comprising:
    a charged particle source;
    an objective lens arrangement; and
    a charged particle detector;
    wherein the objective lens arrangement comprises:
        an object mount for mounting an object to be processed in an object plane;
        a first pole piece and a second pole piece, wherein the first and second pole pieces are substantially rotationally symmetric with respect to an axis of symmetry, wherein a radial inner end of the first pole piece is disposed at a distance from a radial inner end of the second pole piece to form a first gap, wherein the second pole piece is closer to the object mount than the first pole piece;
    a first excitation coil for generating a focusing magnetic field in the first gap;
    a beam tube extending through a bore formed by the radial inner end of the first pole piece; and
    a first voltage source for supplying a voltage to the beam tube such that the beam tube is at a potential different from a potential of the second pole piece,
    wherein the bore extends from a first plane where a diameter of the bore is a minimum diameter to a second plane in which a front surface portion of the first pole piece is disposed, wherein the front surface portion is the portion of the first pole piece disposed closest to the object plane, wherein a diameter of the bore at the front surface portion is a front diameter, wherein a difference between the front diameter and the minimum diameter is more than 10 mm, and wherein a distance between the first and second plane is more than 5 mm,
    wherein the bore has a tapered portion and the bore diameter increases with decreasing distance from the object plane.

* * * * *